US006828860B2

(12) United States Patent
Behzad et al.

(10) Patent No.: US 6,828,860 B2
(45) Date of Patent: Dec. 7, 2004

(54) GIGABIT ETHERNET TRANSCEIVER WITH ANALOG FRONT END

(75) Inventors: Arya R. Behzad, Danville, CA (US); Klaas Bult, LK Boschen Duin (NL); Ramon A. Gomez, Fountain Valley, CA (US); Chi-Hung Lin, Mission Viejo, CA (US); Tom W. Kwan, Cupertino, CA (US); Oscar E. Agazzi, Irvine, CA (US); John L. Creigh, Rancho Santa, CA (US); Mehdi Hatamian, Mission Viejo, CA (US); David E. Kruse, AJ Bunnik (NL); Arthur Abnous, Irvine, CA (US); Henry Samueli, Corona del Mar, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/695,099

(22) Filed: Oct. 28, 2003

(65) Prior Publication Data

US 2004/0085128 A1 May 6, 2004

Related U.S. Application Data

(62) Division of application No. 10/282,688, filed on Oct. 29, 2002, which is a continuation of application No. 09/712,422, filed on Nov. 13, 2000, now Pat. No. 6,472,940.

(60) Provisional application No. 60/181,989, filed on Feb. 11, 2000, provisional application No. 60/164,970, filed on Nov. 11, 1999, provisional application No. 60/164,980, filed on Nov. 11, 1999, and provisional application No. 60/164,981, filed on Nov. 11, 1999.

(51) Int. Cl.[7] .............................................. H03G 3/10
(52) U.S. Cl. ....................................... 330/284; 330/51
(58) Field of Search ......................... 330/284, 51, 279, 330/144, 84; 333/81 R

(56) References Cited

U.S. PATENT DOCUMENTS

| 4,132,957 A | * | 1/1979 | Hekimian et al. | ............ 330/51 |
| 6,621,346 B1 | * | 9/2003 | Nabicht et al. | ............. 330/284 |
| 6,693,491 B1 | * | 2/2004 | Delano | ....................... 330/282 |

* cited by examiner

Primary Examiner—Henry Choe
(74) Attorney, Agent, or Firm—McAndrewd, Held & Malloy, Ltd.

(57) ABSTRACT

Circuitry to remove switches from signal paths in integrated circuit programmable gain attenuators. Programmable gain attenuators and programmable gain amplifiers commonly switch between signal levels using semi-conductor switches. Such switches may introduce non-linearities in the signal. By isolating the switches from the signal path linearity of the PGA can be improved.

14 Claims, 28 Drawing Sheets

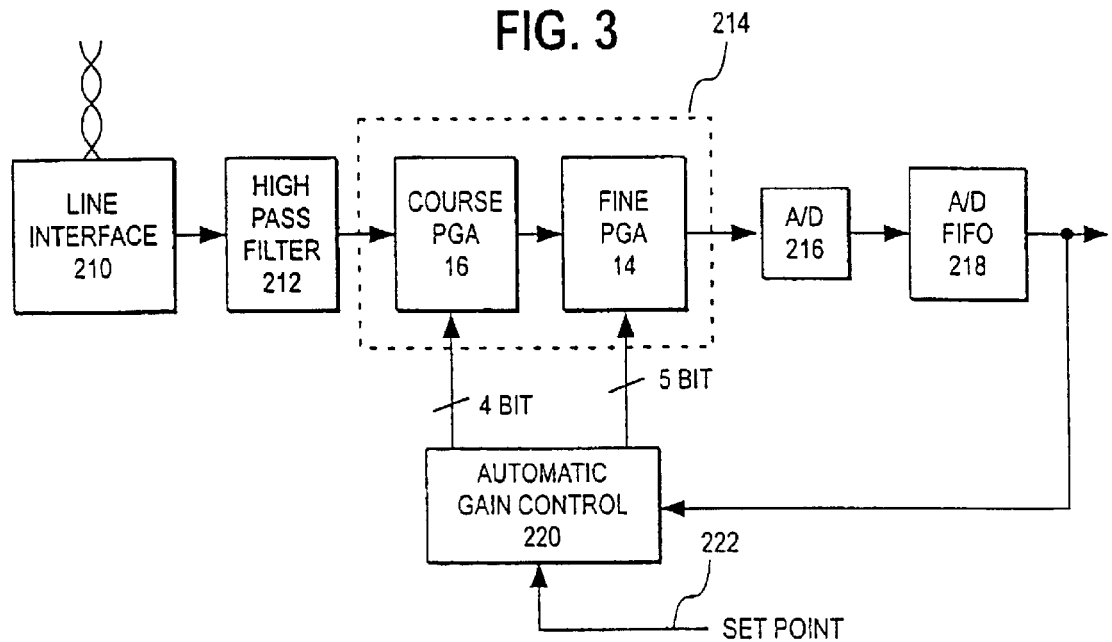
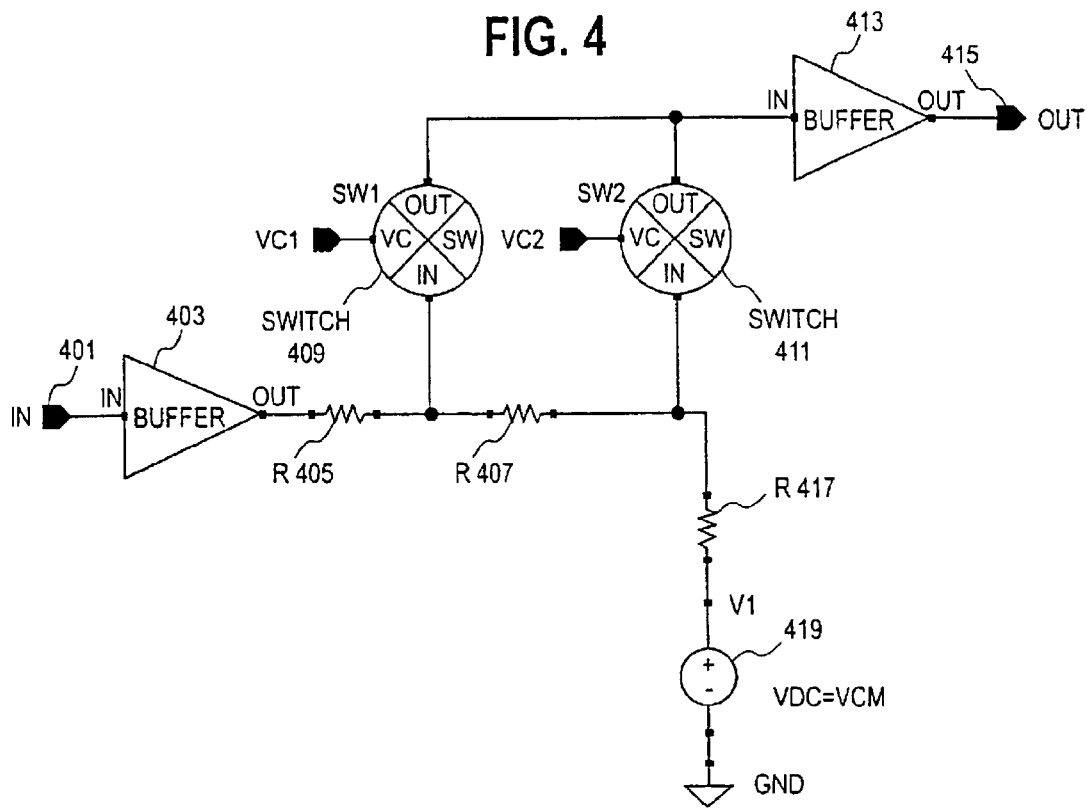

FIG. 34

| CABLE LENGTH (m) | 100 BASE-TX | GIGABIT, 100 OHM | GIGABIT, 85 OHM | GIGABIT, 115 OHM |
|---|---|---|---|---|
| 0 | 3.691281 | 4.193192 | 4.193192 | 4.193192 |
| 20 | 3.806628 | 4.501316 | 4.362110 | 4.291369 |
| 40 | 3.877284 | 4.528136 | 4.457336 | 4.429949 |
| 60 | 3.894216 | 4.733644 | 4.695307 | 4.646305 |
| 80 | 4.055372 | 4.878569 | 4.847844 | 4.810019 |
| 100 | 4.225522 | 4.983545 | 4.991296 | 4.968900 |
| 120 | 4.357733 | 5.134131 | 5.194401 | 5.154263 |
| 140 | 4.556012 | 5.266919 | 5.380943 | 5.366309 |
| 160 | 4.764462 | - | - | - |

TARGET E{|X|} = A/D CLIPPING LEVEL X (E{|X|}/RMS)/(PEAK/RMS)
= 127 X 0.7979/5.2 = 20

US 6,828,860 B2

GIGABIT ETHERNET TRANSCEIVER WITH ANALOG FRONT END

CROSS-REFERENCE TO RELATED APPLICATION(S)

The present Application is a divisional of application No. 10/282,688 filed Oct. 29, 2002 which is a continuation of application No. 09/712,422 filed Nov. 13, 2000 now U.S. Pat. No. 6,472,940, which claims priority from Provisional Application Nos. 60/164,970, 60/164,980 and 60/164,981, filed Nov. 11, 1999, and 60/181,989, filed Feb. 11, 2000.

FIELD OF THE INVENTION

The invention relates to analog circuits in an integrated circuit environment and, in particular embodiments, to low voltage integrated circuits having both digital and analog components.

BACKGROUND OF THE INVENTION

As higher levels of circuit integration are achieved more analog functions are being mixed with digital functions on the same integrated circuit. In addition, as circuit dimensions shrink, integrated circuit supply voltages decrease. There is therefore a need in the art for techniques to facilitate the use of lower voltages in mixed integrated circuits.

SUMMARY OF THE INVENTION

The present invention discloses methods for providing a control signal for a programmable gain attenuator. First an initial value for a fine control portion of a programmable gain attenuator is set. An AGC portion of a control loop then compares an average absolute value of the signal controlled to a reference value. Once the value of the course AGC has converged sufficiently, the operation of the coarse AGC portion of the control loop is terminated and the operation of the fine control portion of the programmable attenuator is begun.

BRIEF DESCRIPTION OF THE DRAWINGS

Referring now to the accompanying drawings in which consistent numbers refer to similar parts throughout:

FIG. 3 is a block diagram of an analog section of an exemplary gigabit receiver.

FIG. 4 is a schematic diagram of a programmable gain attenuator (PGA).

FIG. 34 is a chart of Exemplary Peak to RMS values.

DETAILED DESCRIPTION OF THE INVENTION

Figure 1A:
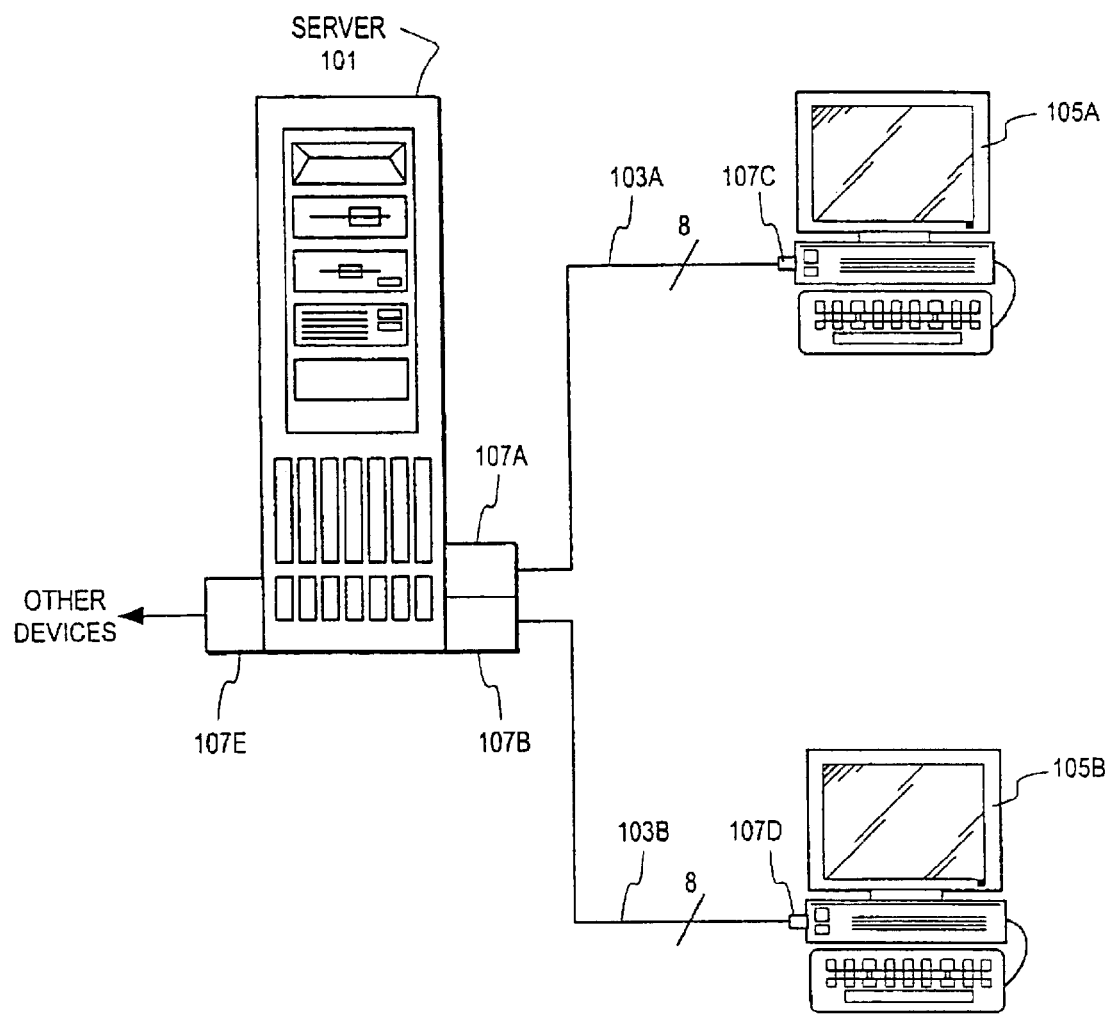
FIG. 1A is a graphic illustration of an environment in which embodiments of the invention may operate.

FIG. 1A is a graphic illustration of an environment in which embodiments of the invention may operate. In FIG.

Figure 1B:
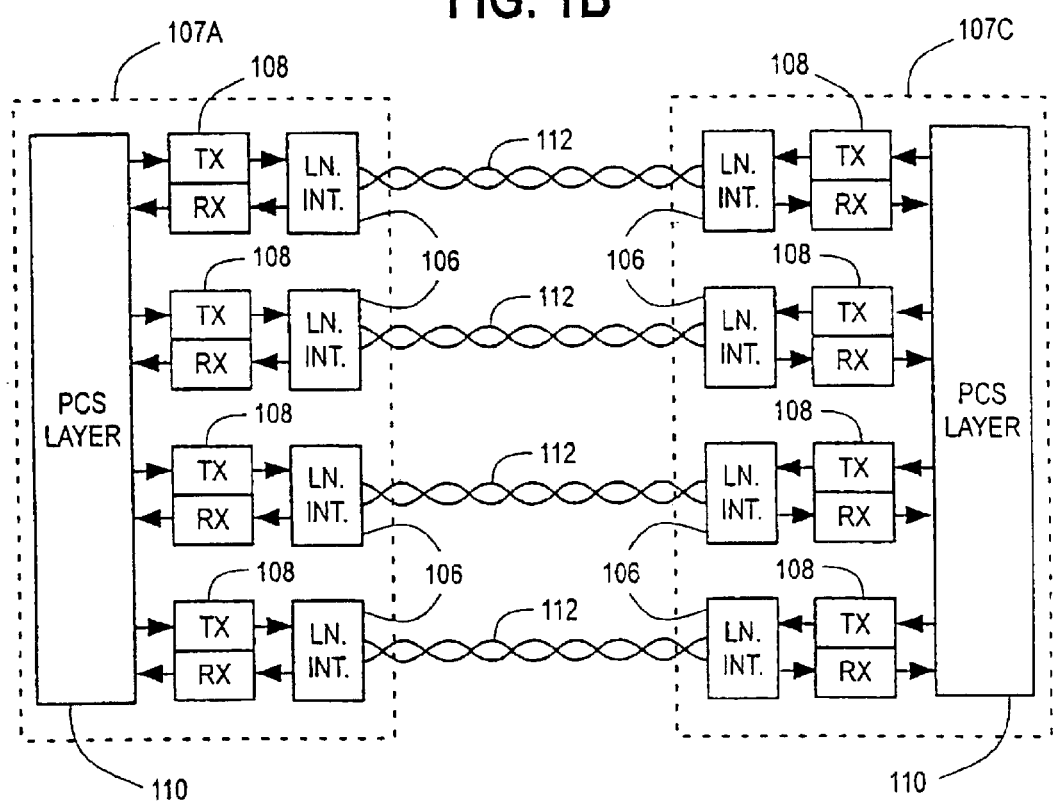
FIG. 1B is a block diagram of an exemplary embodiment of the invention.

1A a server computer 101 is coupled to work stations 105A and 105B through bi-directional communication device, such as a gigabit Ethernet transceiver 107A and 107B. The particular exemplary implementation chosen is depicted in FIG. 1B, which is a simplified block diagram of a multi-pair communication system operating in conformance with the IEEE (Institute of Electrical and Electronic Engineers) 802.3AB standard for 1 gigabit per second (GB/S) Ethernet full-duplex communication over 4 twisted-pairs of category-5 copper wires. Gigabit transceiver 107A is coupled to work station 105A via a communication line 103A. The communication line 103A includes 4 twisted-pair of category-5 copper wires. Communications line 103A is coupled to a bidirectional gigabit Ethernet transceiver 107C which may be identical to the bidirectional gigabit Ethernet transceiver 107A. Similarly, server 101 also communicates through a gigabit Ethernet transceiver 107B using a 4 twisted-pair set of category-5 copper wires 103B coupled to an Ethernet transceiver 107D, which is further coupled to work station 105B. The work stations may be further coupled to other Ethernet devices. The server 101 may also be coupled via an Ethernet device 107E and to other devices, such as servers or computer networks.

FIG. 1B is a block diagram of an exemplary embodiment of the invention within the communication system illustrated in FIG. 1A. The communication system illustrated in FIG. 1B is represented as a point-to-point system, in order to simplify the explanation, and includes two main transceiver blocks 107A and 107C, coupled together with 4 twisted-pair cables. Each of the wire pairs 112A, B, C, and D is coupled between the transceiver blocks 107A and 107C through a respective 1 of 4 line interface circuits 106. Each line interface circuit communicates information developed by respective ones of 4 transmitter/receiver circuits (constituent transceivers) 108 coupled between respective interface circuits and a physical coding sublayer (PCS) block 110. Four constituent transceivers 108 are capable of operating simultaneously at 250 megabits per second (MB/S), and are coupled through respective interface circuits to facilitate full-duplex bidirectional operation. Thus, one GB/S communication throughput of each of the transceiver blocks 107A and 107C is achieved by using 4 250 MB/S (125 megabaud at 2 bits per symbol) constituent receivers 108 for each one of the transceiver blocks and 4 twisted-pairs of copper cables to connect to the two transceivers together.

Figure 2:
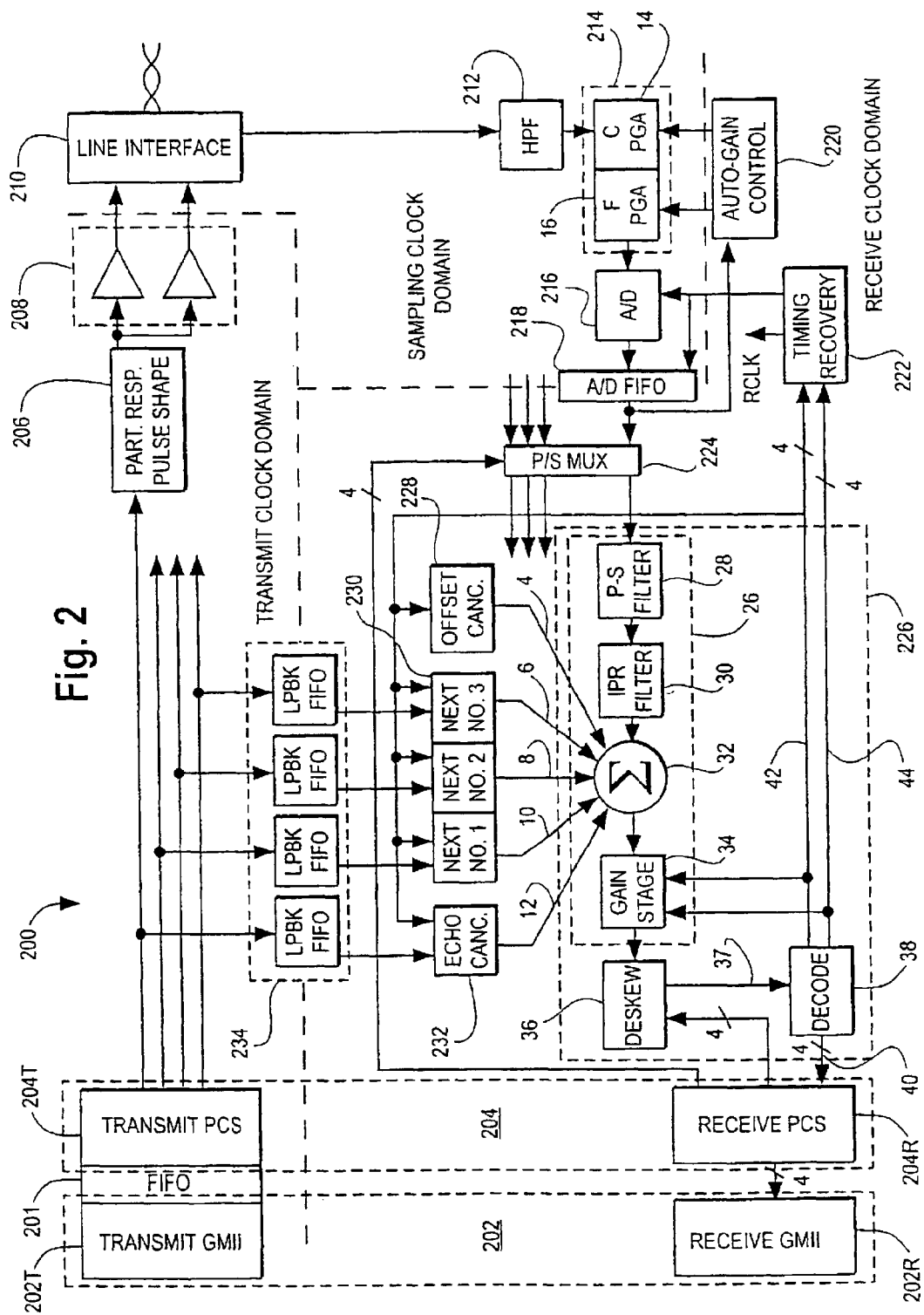
FIG. 2 is a simplified block diagram of the functional architecture and internal construction of an exemplary transceiver block.

FIG. 2 is a simplified block diagram of the functional architecture and internal construction of an exemplary transceiver block, indicated generally at 200, such as transceiver 107A. Since the illustrated transceiver application relates to gigabit Ethernet transmission, the transceiver will be referred to as the "gigabit transceiver." For ease of illustration and description, FIG. 2 only shows one of the four 250 MB/S constituent transceivers which are operating simultaneously (termed herein 4-D operation). However, since the operation of the four constituent receivers are necessarily interrelated, certain blocks in the signals lines in the exemplary embodiment of FIG. 2 perform and carry four-dimensional (4-D) functions and 4-D signals, respectively. By 4-D it is meant that the data from the four constituent receivers are used simultaneously. In order to clarify signal relationships in FIG. 2 and FIG. 1B, single lines which correspond to more than one line are represented by a slash followed by a number. The slash followed by the number indicates the number of lines represented by the single illustrated line.

With reference to FIG. 2, the gigabit transceiver 200 includes a Gigabit Medium Independent Interface block 202, a Physical Coding Sublayer (PCS block) 204, a pulse-shaping interface block 210, a high-pass filter 212, a programmable gain amplifier (PGA) 214, an analog-to-digital (A/D) converter 216, an automatic gain control block 220, a timing recovery block 222, a pair swapping multiplexer block 224, a demodulator 226, an offset canceler 228, a near-end cross talk (NEXT) canceler block 230 having three NEXT cancelers, and an echo canceler 232. The gigabit transceiver 200 also includes A/D first-in-first-out buffer (FIFO) 218 to facilitate proper transfer of data from the analog clock region to the received clock region, and a FIFO block 234 to facilitate proper transfer of data from the transmit clock region to the receive clock region. The gigabit transceiver 200 can optionally include a filter to cancel far and cross-talk noise (FEXT canceler).

On the receive path, the line interface block 210 receives an analog signal from the twisted pair cable. The received analog signal is preconditioned by high-pass filter 212 and a programmable gain amplifier (PGA) 214 before being converted to a digital signal by the A/D converter 216 operating at a sampling rate of 125 MHZ. Sample timing of the A/D converter 216 is controlled by the output of a timing recovery block 222 controlled, in turn, by decision and error signals from a demodulator 226. The resulting digital signal is transferred from the analog clock region to the received clock region by an A/D FIFO 218, an output of which is also used by an automatic gain control circuit 220 to control the operation of the PGA 214.

FIG. 3 is a block diagram of the analog section of an exemplary gigabit receiver. In FIG. 3, line interface 210 receives data from a twisted pair, which comprises one-quarter of the gigabit receiver interface. The data received by the line receiver is then coupled into a high pass filter 212, which filters the data and further couples it to the programmable gain amplifier 214. The programmable gain amplifier 214 includes sections: a coarse programmable gain attenuator 16 and a fine programmable gain attenuator 14. The signal, which is input to the PGA, is first attenuated by the coarse PGA 16 and then the signal is provided to the fine PGA 14. Because the signal levels for the coarse PGA are higher than the signal levels of the fine PGA different designs for each may be employed. The fine PGA 14 provides an attenuated signal to an converter 216. The A/D converter 216 accepts the attenuated signal from the 14, digitizes it, and provides the digitized signal to an A/D FIFO 218. An automatic gain control (AGC) examines the values in the A/D FIFO 218 and then provides adjustment to the PGA 214. The automatic gain control 220 adjusts the coarse PGA (16) by using a four-bit digital signal. The automatic gain control also controls the fine PGA (14) using a five-bit digital signal.

The PGA 214 can be a programmable gain attenuator or it may be coupled to a fixed at variable amplifier to form a programmable gain amplifier, as the structure of the PGA is compatible with either. The distinction is somewhat academic as a programmable gain amplifier may amplify a signal by less than 1. Therefore both the programmable gain amplifier and programmable gain attenuator shall be referred to hereafter as a programmable gain amplifier (PGA).

Programmable gain attenuators commonly employ switches in order to change between gain settings. These switches are commonly semiconductor integrated switches, which may cause problems because of non linearities, capacitance, and other characteristics inherent in the switches. In FIGS. 4 through 8 these problems and embodiments of solutions are discussed.

FIG. 4 is a schematic diagram of a illustrative prior art programmable gain attenuator. In FIG. 4, an input signal is accepted at the input 401 to buffer 403. The buffered signal is then divided among resistors R405, R407 and R417, according to their resistance values. Common mode voltage 419 provides a DC bias for signals being coupled into the input of buffer 413.

By selecting either switch 409 or switch 411, different attenuations are selected, resulting in different signal being coupled into buffer 413. Buffer 413 may be a fixed amplifier, thereby providing an output signal multiplied by the gain of the buffer 413. If switch 409 is closed, the voltage tap, defined by the junction of resistor R405 and resistor R407, will provide the input to buffer 413. However, if switch 411 is closed, the voltage appearing at the voltage tap defined by the junction of R407 and R417 will be provided to buffer 413. By selecting either switch 409 or 411, a variable gain can be programmed into the PGA circuit of FIG. 4.

There are, however, problems with the circuit arrangement illustrated in FIG. 4. One problem is that no matter which tap is selected, a switch is directly in the signal path accordingly the signal is affected by characteristics of the switch. Because the switch is not a perfect switch it has a finite non linear resistance. The resistance of the switch forms a voltage divider with the input impedance of buffer 413. The voltage divider changes the signal level to the input of buffer 413. To decrease the influence of switches 409 and 411 on the voltage provided to the input of buffer 413, it is desirable to make switch resistance as low as possible. Making switches 409 and 411 physically larger will decrease switch resistance. As a switch is enlarged the capacitance of the switch increases. As the capacitance of the switch increases, the bandwidth of the PGA decreases. Therefore, there is a tradeoff between switch resistance and bandwidth. In addition, because of the common mode voltages and the low power supply voltage commonly available in mixed analog and digital ICs, it may be difficult to provide the necessary drive, with the available voltages, to insure good capacitance. In other words, it may be difficult to assure complete conduction of the switch with the control voltages available to control the switch.

Figure 5:
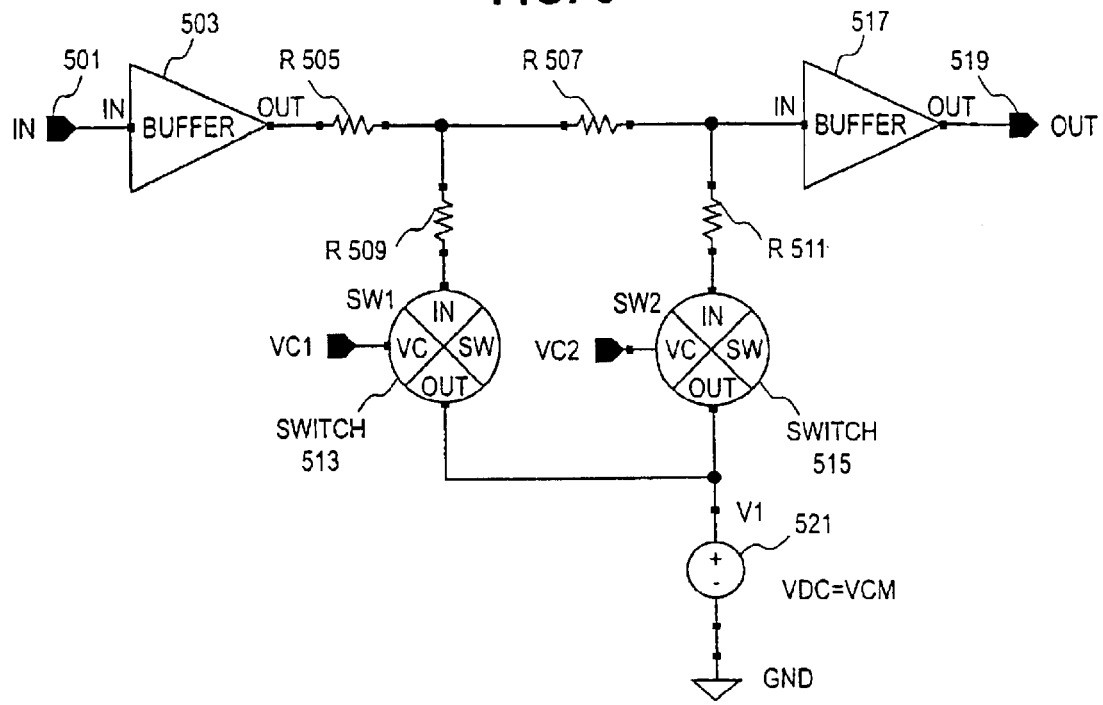
FIG. 5 is a schematic diagram, according to an embodiment of the present invention.

FIG. 5 is a schematic diagram according to an embodiment of the present invention. In FIG. 5, each voltage divider tap has an individual termination resistor. In the PGA of FIG. 5, the signal to be amplified is coupled into buffer 503 through input 501. If switch 513 is on and switch 515 is off, the tap voltage at the junction of R505 and R509 is coupled through resistor 507 into buffer 517. Because the impedance of buffer 517 is generally very high the amount of current flowing through R507 is typically negligible. If switch 515 is on the tap voltage at the junction of resistor R507 and resistor R511 appears as the input to buffer 517 resistor R509 is chosen so that switch 513 is of negligible resistance when compared with R509. (Similarly, switch 515 is of negligible resistance when compared with resistor R511). Additionally, since the signal path is always from buffer 503 through resistor R505 and resistor R507 into buffer 517, neither switch is in the signal path, and the effect of switch nonlinearities and switch capacitances are minimized. Even if switch 513 and switch 515 are nonlinear, the nonlinear resistances provided by those switches are small compared with resistor R509 or resistor R511. Because the nonlinear resistance of the switches is small compared to the termination resisters R509 and R511, the overall contribution of the nonlinear resistance of the switches on the voltage, which is coupled into buffer 517 is small. Additionally any switch capacitance is isolated from the signal path by termination resistors R509 and R511. In contrast in the circuit of FIG. 4, the signal to be amplified travels through the switches and the switch capacities add in parallel. Therefore, if an architecture similar to FIG. 4 is used, the capacitance of the switches tend to accumulate as additional switches are added. In contrast, in FIG. 5 the capacities of the switches are isolated from the signal path by termination resistors R509 and R511. As a consequence, control switches, such as those illustrated in FIG. 4, may be constrained to be of the transmission type, comprising PMOS and NMOS devices which are more conductive but are more complicated to use than NMOS (Metal Oxide Semiconductor) switches. A simple NMOS switch, however, may be used with the arrangement illustrated in FIG. 5.

Figure 6:
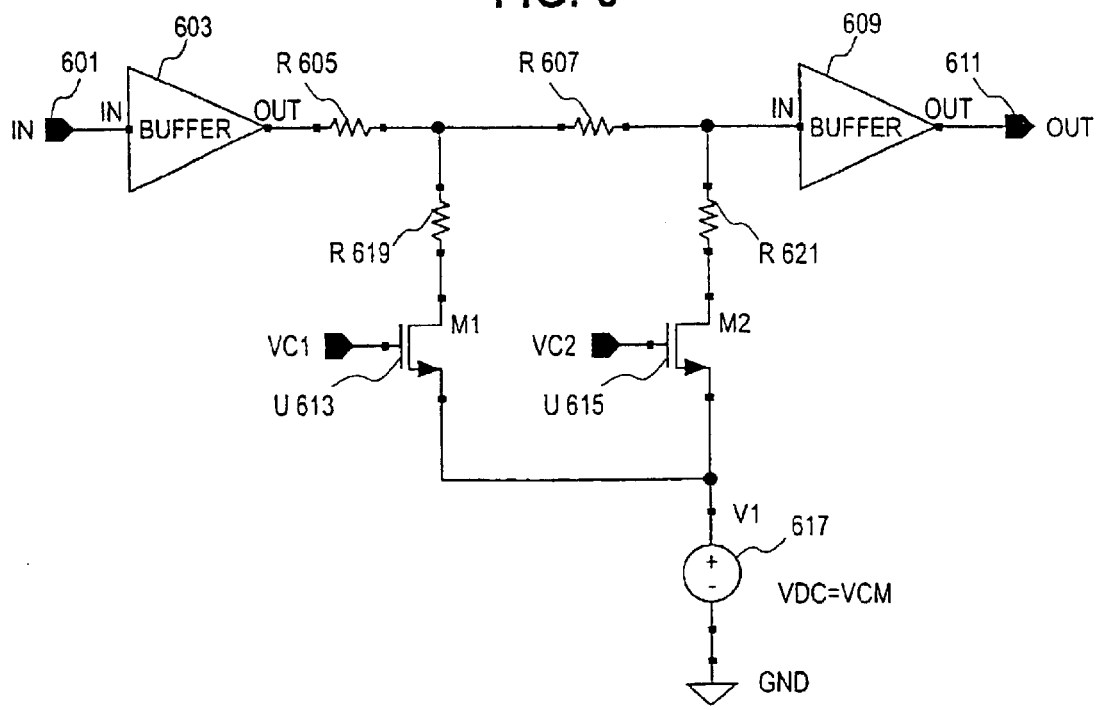
FIG. 6 is a schematic diagram, according to an embodiment of the present invention.

FIG. 6 is a schematic diagram similar to FIG. 5 except that the ideal switches illustrated in FIG. 5 have been replaced by NMOS switching devices. In FIG. 6, the signal to be amplified is provided to input 601 of buffer 603. If device U613 is turned on and U615 is turned off, then the voltage divider comprises R605 and R619. If U615 is turned on, and U613 is turned off, then a divider is formed from resistors R605, R607 and R621. Because R619 and R621 isolate the switching devices U613 and U615, from the signal path, the on-state resistance of U613 and U615 are of less consequence than the on-state resistance of the switches in the circuitry of FIG. 4. That is, instead of having to use the "expensive" transmission type switch, as would be the case in embodiments using the arrangement of FIG. 4, devices such as U613 and U615 can be made. For example, U613 and U615 can be simple NMOS (Negative Metal Oxide Semiconductor) type devices. The size of U613 and U615 is dictated, in part, by the resistance of R619 and R621, which isolate U613 and U615 from the signal path.

Figure 7:
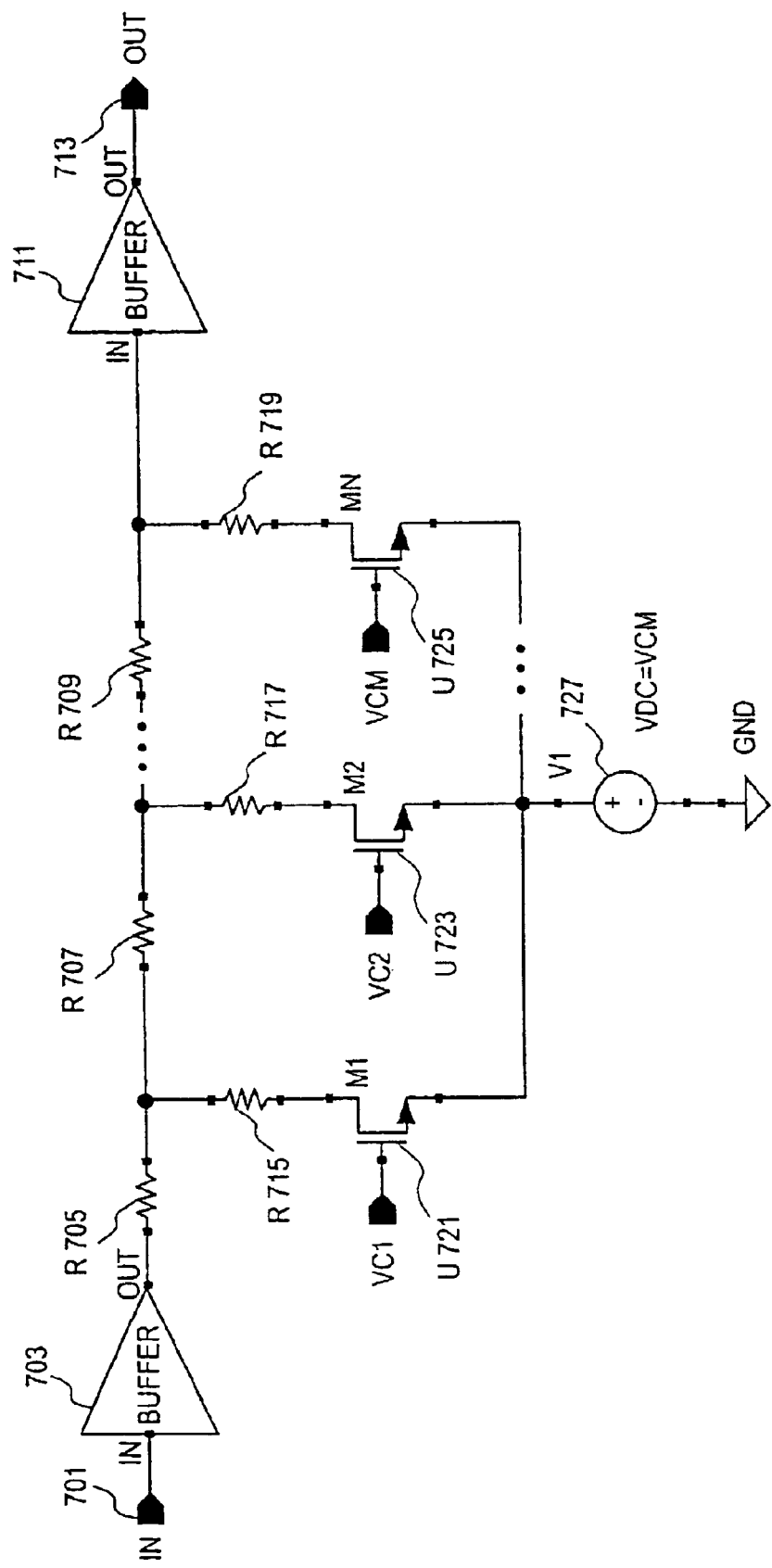
FIG. 7 is a graphical illustration of a multiple switch (and multiple tap) programmable gain attenuators (PGA).

FIG. 7 is a graphical illustration of a multiple switch and multiple (tap) PGA. In the diagram of FIG. 7, the signal to be amplified is provided to buffer 703 through input 701. The signal travels through a resistor network represented by R705, R707 and R709. Any number of resistors can be included between R707 and R709. At each resistor junction (tap), a terminating resistor such as terminating resistor R17, is inserted. When one switch is turned on, and the other switches are turned off, the terminating resistor connected to that switch forms a voltage divider with the resistor network, thereby providing a divided input to buffer 711. As illustrated in FIG. 7, any number of switches and terminating resistors can be accommodated. It is possible to add multiple switches partly because each switch is isolated from the signal path instead of the signal having to travel through the switch as in FIG. 4. In addition, the capacitance of the switches in FIG. 7 have much less effect on the signal being amplified than the switches illustrated in FIG. 4. The terminating resistors in FIG. 7 isolate the switch's capacitance from the signal path, thereby allowing more switches to be added, with less effect on the bandwidth of the PGA.

Figure 8:
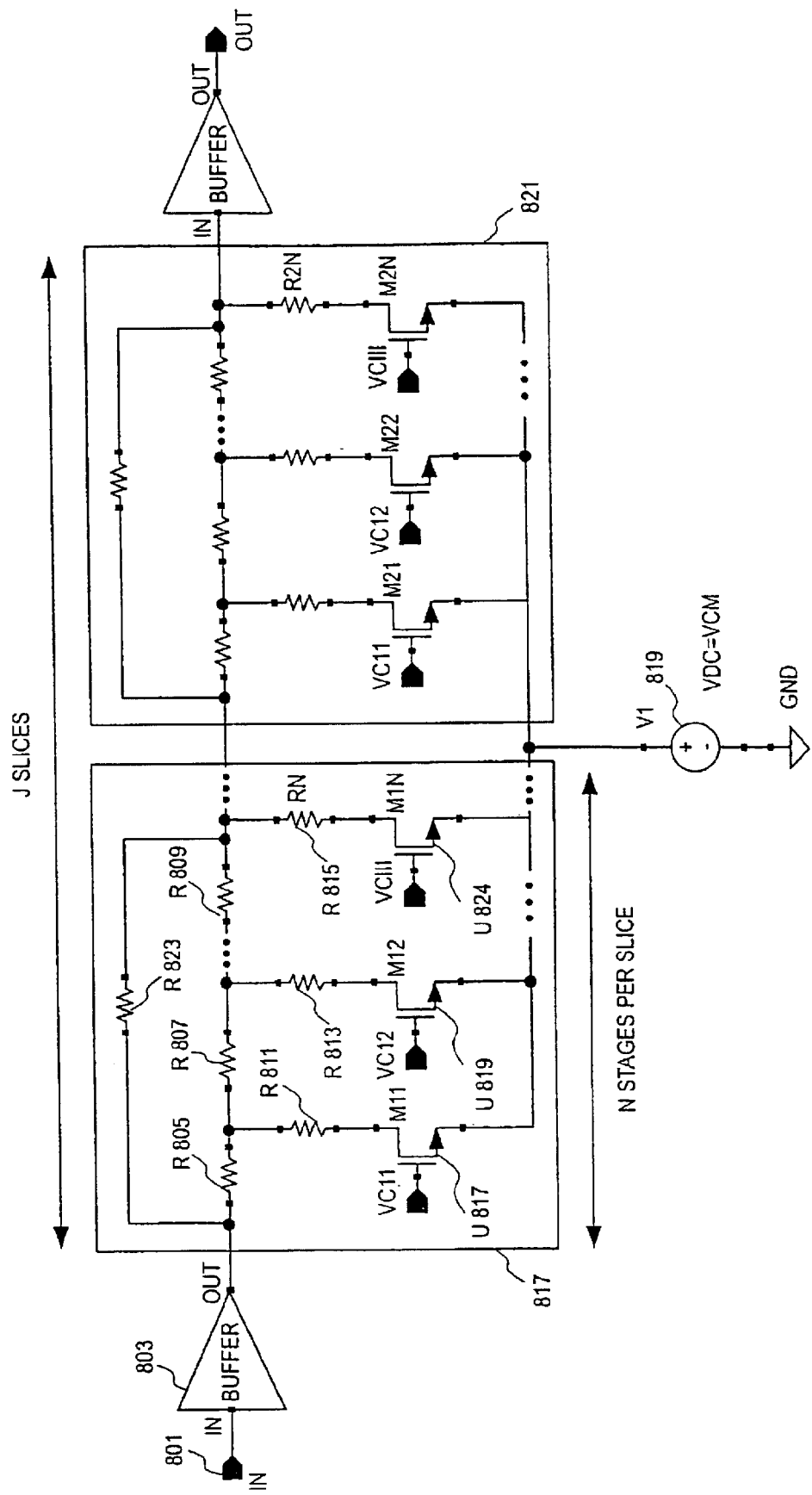
FIG. 8 is a schematic diagram illustrating a multi slice variant of a programmable gain attenuator, according to an embodiment of the invention.

FIG. 8 is a schematic diagram illustrating a multi-slice variant of a programmable gain attenuator, according to an embodiment of the invention. In the Embodiment illustrated in FIG. 8, the PGA is segmented into slices. An interpolation resistor R823 may then be applied in parallel with each slice. Interpolation resistor R823 helps reduce the ratio between, for example, R805 and R811; or R805, R807 and R813; or R805, R807, R809 and R815, etc. By reducing the ratio necessary between inline resistors such as R805 and R807, radically different resistor values are not required for a certain step attenuation setting (for example, 1 dB/step). Any number of slices may be joined together in series in order to implement a programmable gain attenuator.

If the signal provided to the PGA is large enough to cause the absolute voltages on certain nodes within the PGA to exceed the power supply voltage, distortion can result. A common configuration for PGA which may show such distortion is illustrated in FIG. 9.

Programmable gain attenuators are commonly employed in integrated circuits having low voltage supplies. The low voltage supply can cause problems when large input signals are coupled into PGA's. In FIGS. 9 through 10 examples of such problems are illustrated. In FIGS. 11 through 14 embodiments which deal with such types of problems are discussed.

Figure 9:
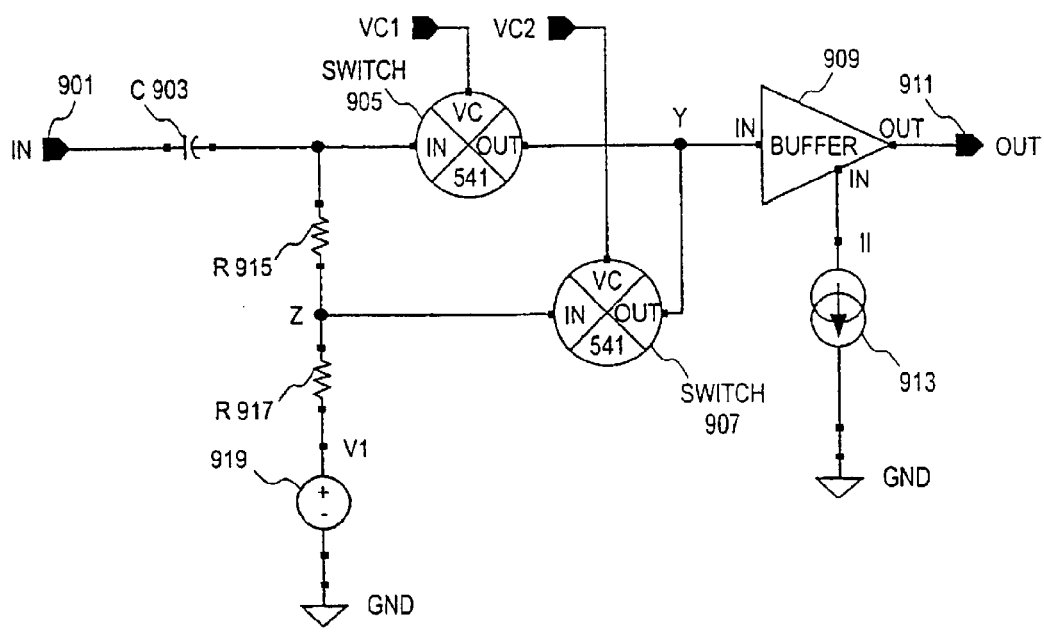
FIG. 9 is a schematic diagram of a exemplary prior art PGA.
Figure 10:
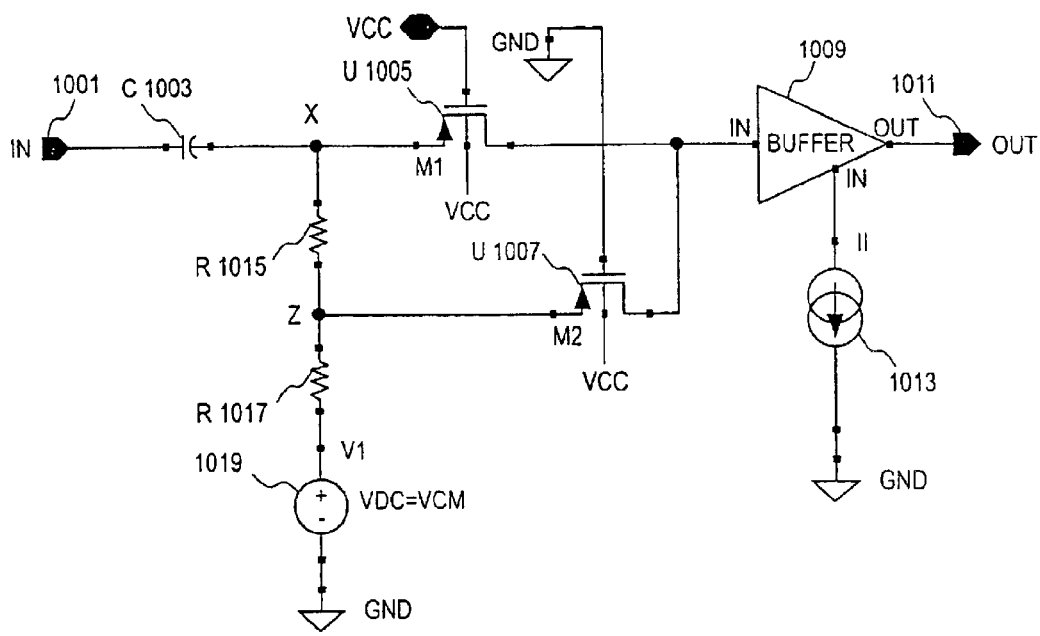
FIG. 10 is a schematic diagram illustrating exemplary prior art circuitry.

FIG. 9 is a schematic diagram of an exemplary prior art PGA. An input signal at input 901 is coupled by capacitor C903 into the PGA circuit. Voltage source 919 provides any common mode voltage which is needed by buffer 909. The input signal is divided through the resistive ladder comprising resistors R915 and R917. The desired signal level can be tapped from the resistive ladder through the use of switches 905 or 907. If the voltage amplitude of the signal input at 901 is large enough, it may exceed the power supply voltage, which is used to turn switches 905 and 907 off and on. If the input signal plus the common-mode voltage 919 exceeds the supply voltage, switch 905 or switch 907 may encounter difficulties turning on or turning off. So, for example, if a large signal is provided to input 901 through capacitor C903 to switch 905, the positive portion of the input signal may forward bias switch 905.

Once switch 905 is forward biased, for example by a large amplitude input signal, switch 905 will begin to turn on, and a voltage spike may be coupled into buffer 909. This condition is illustrated more fully in FIG. 10, in which the ideal switches of FIG. 9 are replaced with actual MOS switching devices.

FIG. 10 is a schematic diagram illustrating exemplary prior art circuitry. In FIG. 10, an input signal is coupled into input 1001. The input signal is then further coupled through capacitor 1003 and into resistor network R1015 and R1017. If switch U1007 is initially turned on, the input signal is divided by the voltage divider comprising resistors R1015 and R1017. The tap voltage at the junction of resistors R1017 and R1015 is coupled by switch U1007 into buffer 1009. If a signal with a large enough peak voltage enters at input 1001, the voltage at the source of U1005 may exceed $V_{cc}$ the (supply voltage), which is coupled to the gate of U1005. When the source voltage of device U1005 exceeds its gate voltage by an amount approaching threshold voltage, U1005 will start to turn on. Once device U1005 turns on, the attenuating effect of resistor R1015 on the signal applied to the buffer 1019 is eliminated and the input signal is coupled directly into buffer 1009. This signal dependent turning on of device U1005 may cause a significant nonlinearity. Such nonlinearities may be extremely detrimental to circuit performance. The situation is exacerbated by the fact that the common-mode voltage 1019 may be high, and the power supply voltage of modern mixed analog and digital integrated circuits tends to be low.

Figure 11:
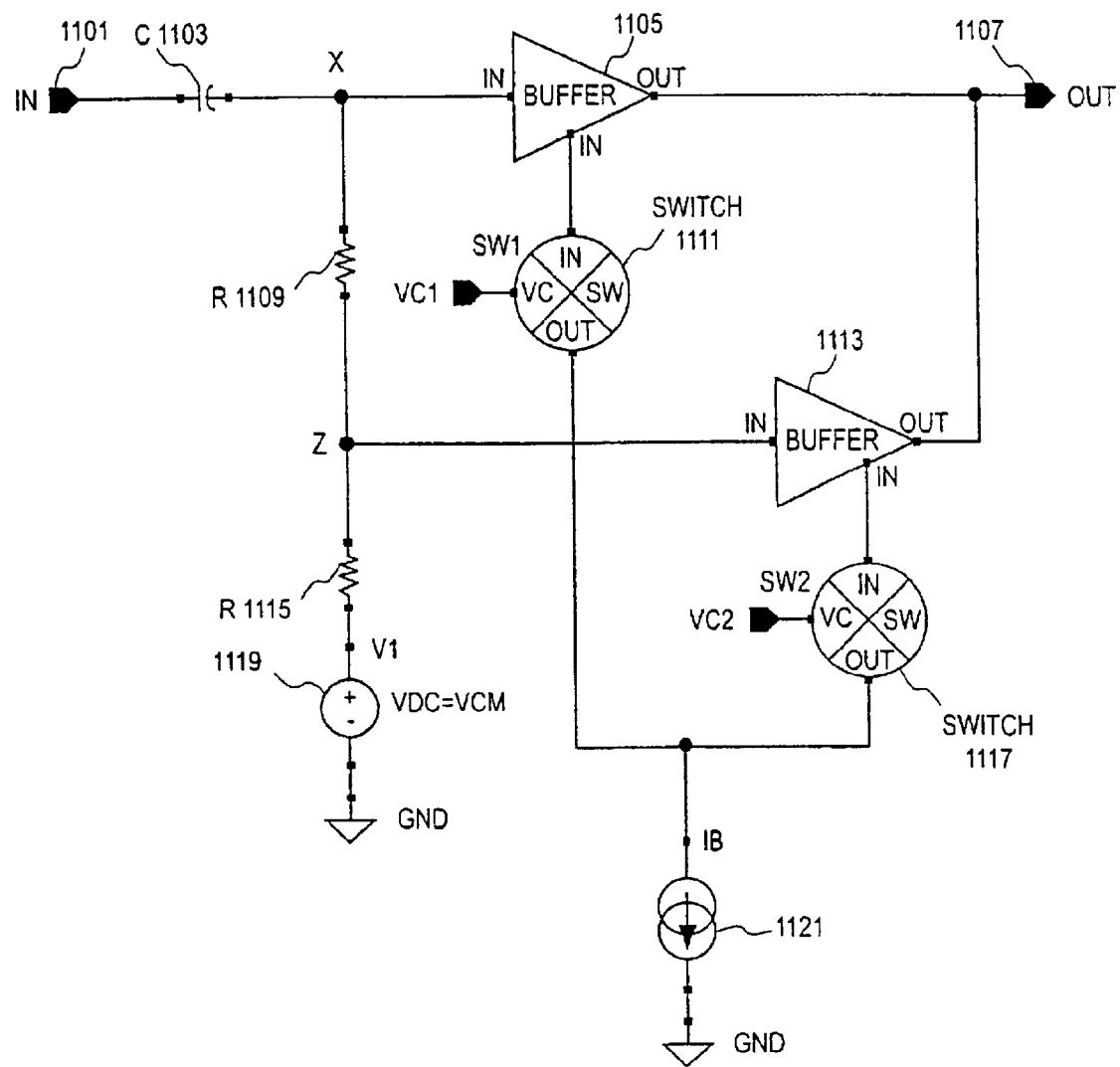
FIG. 11 is a schematic diagram according to an embodiment of the present invention.

FIG. 11 is a schematic diagram according to an embodiment of the present invention. Divider circuitry in FIG. 11 is identical to the divider circuitry FIG. 10. That is, input 1101 receives an input signal, couples it into a capacitor C1103, which further couples the input signal into a voltage divider comprising resistors R1109 and R1115. The circuitry of FIG. 11 also comprises a common mode voltage source 1119. However, unlike the circuit of FIG. 10, the tapped output of the voltage divider R1109 and R1115 is coupled into a buffer amplifiers 1113. Similarly, the voltage tap comprising capacitor C1103 and resistor R1109 is coupled into a buffer amplifier 1105. The buffer amplifiers 1105 and 1113 are controlled by switches 111 and switch 117, respectively. Switches 111 and switch 117 essentially provide the operating current for each buffer amplifier (U1105 and U1113), when the corresponding switch is closed. No operating current to the buffer amplifier is provided when the corresponding switch is open. Accordingly, switch 1111 is not in the input circuit path and is not subject to turn on due to the variations in input signal. The signal at the junction of C1103 and R1109 is coupled into the input of buffer 1105. If the voltage at the junction of C1103 and R1109 exceeds the power supply of voltage and no current is being provided to buffer amplifier 1105, nothing happens because buffer amplifier 1105 is not active. Therefore, even when the voltage at the junction of C1103 and R1109 exceeds the power supply voltage none of the voltage is coupled through to an output 1107 because the buffer 1105 has been deactivated. Buffer 1105 isolates switch 1111 and the output 1107 from large input signals.

Figure 12:
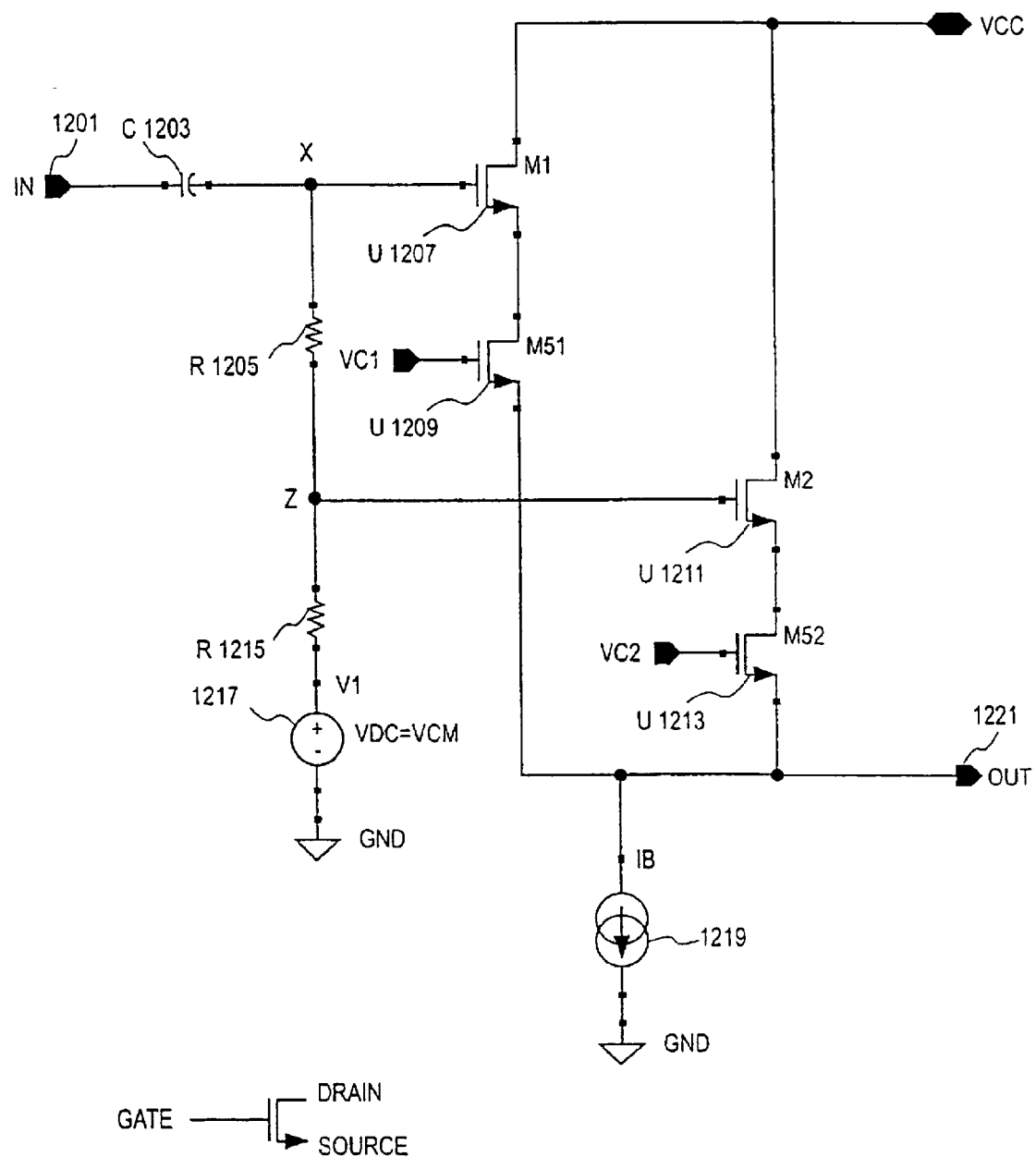
FIG. 12 is a schematic diagram of an exemplary embodiment of the present invention.

FIG. 12 is a schematic diagram of an implementation of the circuit illustrated in FIG. 11. In the circuit of FIG. 12 the ideal switches 1111 and 1117 have been replaced by NMOS (Negative Metal Oxide Semiconductor) switches. Additionally, buffer amplifier 1105 has been replaced by a MOS follower U1207, and buffer amplifier 1113 has been replaced by a MOS follower U1211. So, for example, if follower 1211 has been selected by placing a high level control voltage at the gate of device U1213, then the voltage at the output 1221 will reflect the voltage at the junction of R1205 and R1215. U1213 is turned on by placing a high voltage on its gate. U1209 may be turned off by grounding its gate. Once the gate of U1209 is coupled to ground no current can flow through device 1209. If a large voltage spike occurs at the junction of C1203 and R1205 it will couple to the gate of U1207 (except possibly for a small amount of capacitive coupling), however, the voltage spike will not be coupled through U1207 because there is no current flowing in the device 1207 (unless the voltage is so high at the gate of 1207 that the actual gate insulation of device U1207 breaks down).

The configuration of FIG. 12, however, places switches U1209 and U1213 in the signal path. Therefore, non-linearities from devices U1209 and U1213 can be introduced into the signal. It is desirable to remove switching components from signal interaction by removing them from the signal path.

Figure 13:
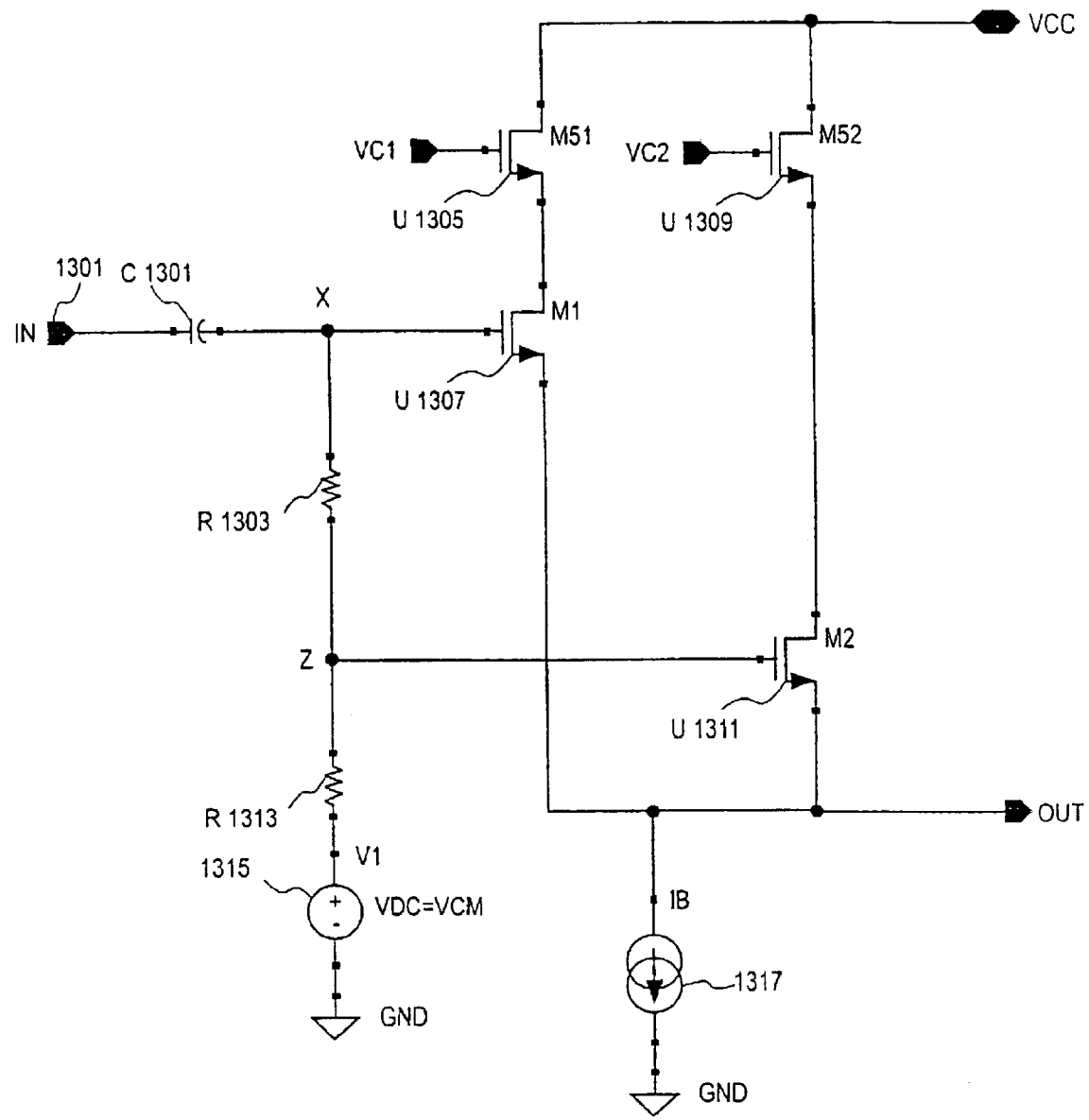
FIG. 13 is a schematic diagram of a PGA, in which switches have been removed from the signal path.

FIG. 13 is a schematic diagram of a PGA similar to FIG. 12 except that the switches have been moved from the signal path by placing them in the drain circuit of amplifiers U1307 and U1317 rather than in the source circuit. By coupling the gate of either U1305 or U1309, to ground the amplifier devices U1307 and U1311 are respectively turned off. Therefore, if a large signal is input to 1301 it may coupled across capacitor C1301, and thus appear at the gate of U1307. U1307 may attempt to turn on if the input voltage at the junction of C1301 and R1303 is high enough. However, if the device 1305 has its gate coupled to ground, preventing a current from flowing in U1307 regardless of the voltage at its gate. In this manner, by placing the switch device within the drain of the follower device, the problem of having a large voltage input turn on the device and the problem of having the switch in the signal path are both avoided.

Figure 14:
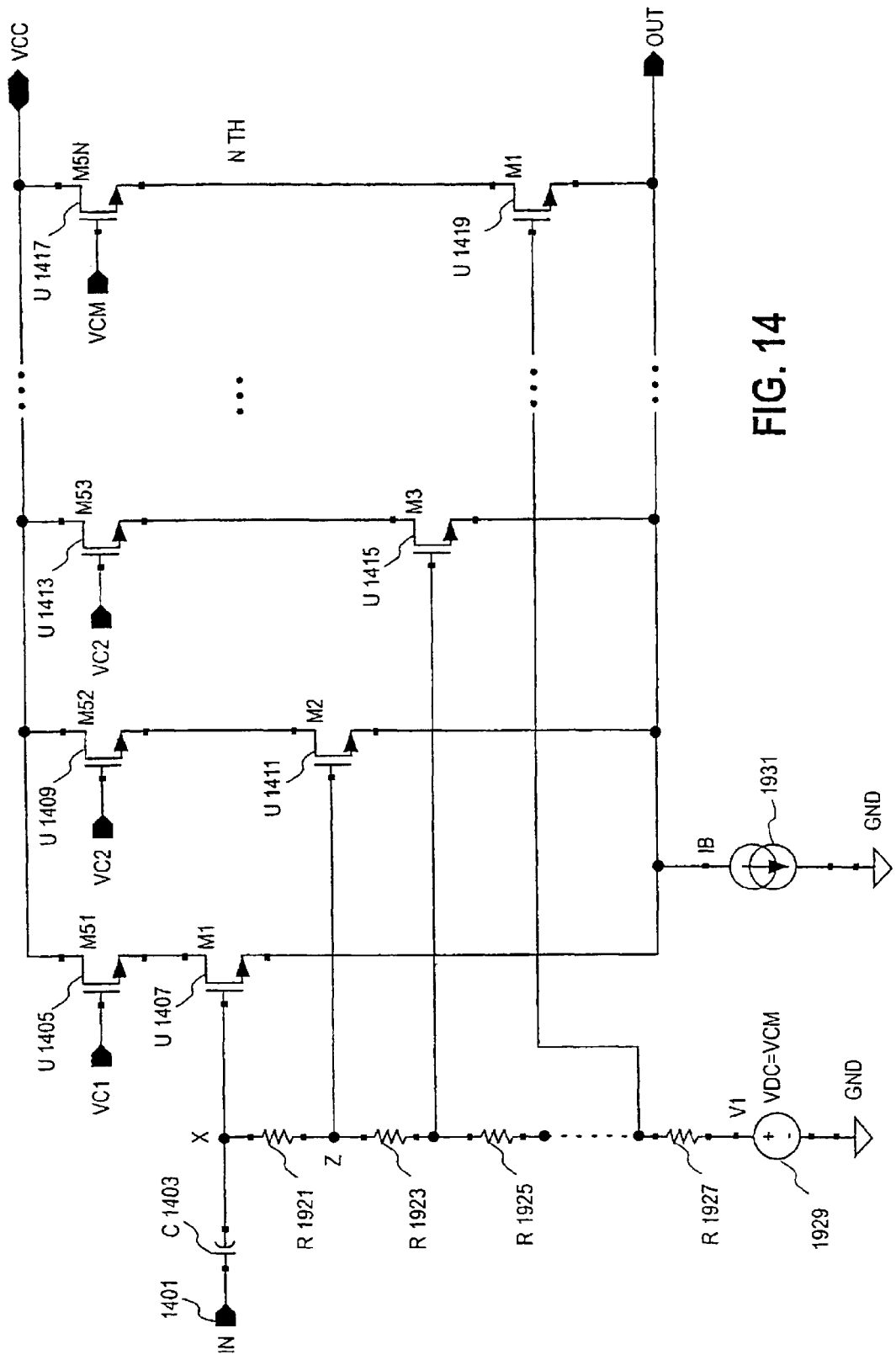
FIG. 14 is a schematic diagram of a PGA having N taps.

FIG. 14 is a schematic diagram of a programmable gain attenuator having multiple taps. In FIG. 14, input signal is coupled into the PGA through input 1401. The input signal is then AC coupled across capacitor 1403 and into a resistive ladder comprising resistors R1921, R1923, R1925, R1927, and common mode voltage source 1929. Each voltage tap of the circuit is connected to a follower device such as U1407, U1411, U1415, or U1419. The switch devices are all placed in the drain circuit of the amplification devices. So, for example, follower device U1407 has switch device U1405 in its drain circuit. Similarly, in the final stage of the PGA, switch 1417 is in the drain circuit of amplification device 1419. Similarly, multiple taps can be accommodated.

Commonly programmable gain attenuators may be combined with a high pass function. FIGS. 15 through 20 illustrate problems encountered and embodiments of the present invention which deal with such problems.

Figure 15:
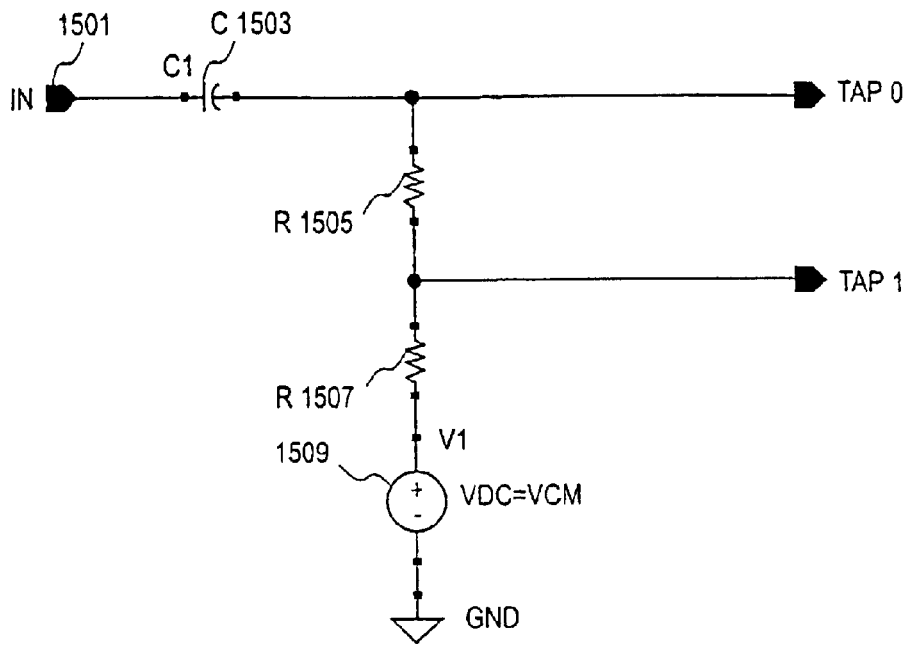
FIG. 15 is a schematic of a high-pass filter combined with a PGA.

FIG. 15 is a schematic of a high-pass filter combined with a programmable gain attenuator (HPGA). Due to the large signal levels and low supply voltages in many mixed analog and digital integrated circuit applications, a metal-metal or poly-poly capacitor is commonly used for capacitor C1503 at the input of such a network. Such a capacitor is generally not tunable. Also, resistors R1505 and R1507 are not tunable. The high pass corner (3 dB point) can be adjusted by switching capacitance or resistance in and out of the circuit. Generally, the preferred method is to switch resistors in and not capacitors. This is because the signal levels at the input of the capacitor may be significantly larger than elsewhere in the circuit.

In FIG. 15, the high pass corner of the circuit illustrated is formed by a combination of C1503, R1505 and R1507. The high pass corner frequency is independent of where voltages are tapped (tap 0 or tap 1). The high pass corner is dependent on the input capacitance C1503 and the series resistance of R1505 and R1507. The voltage obtained from the programmable gain high pass filter is dependent on whether tap 0 or tap 1 is employed as the voltage output tap. The corner frequency of the C1503, R1505, R1507 network, however, does not change no matter which voltage tap is used. The corner frequency is dependent only on the value of C1503 and the serial combination R1505 and R1507.

It is also desirable that the changing of the high pass corner frequency not affect the gain of the programmable gain attenuator portion of the circuit. Some mechanism for adjusting the high pass corner frequency of the circuit without changing the gain of the circuit is needed.

Figure 16:
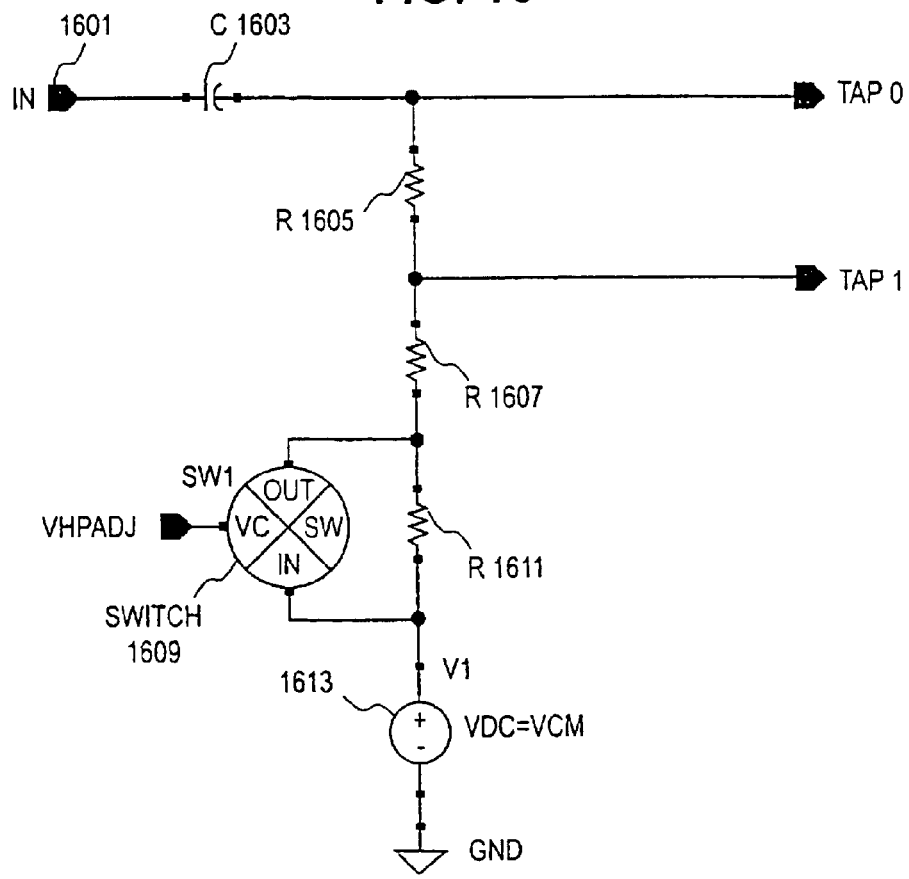
FIG. 16 is a schematic diagram of a circuit which may be used to adjust a corner frequency of a high-pass filter PGA combination (HPGA).

FIG. 16 is a schematic diagram of a circuit which may be used to adjust the corner frequency by using a switch 1609 to short out resistor R1611. By shorting out R1611 the overall series resistance of the serial combination of R1605, R1607 and R1611 is changed. Because the resistance in series with capacitor 1603 is changed the corner frequency is changed. Shorting out R1611, however, will change the gain that is available at tap 0 and tap 1 of the circuit. It is preferable that when the corner frequency changes the gain per tap not change.

Figure 17:
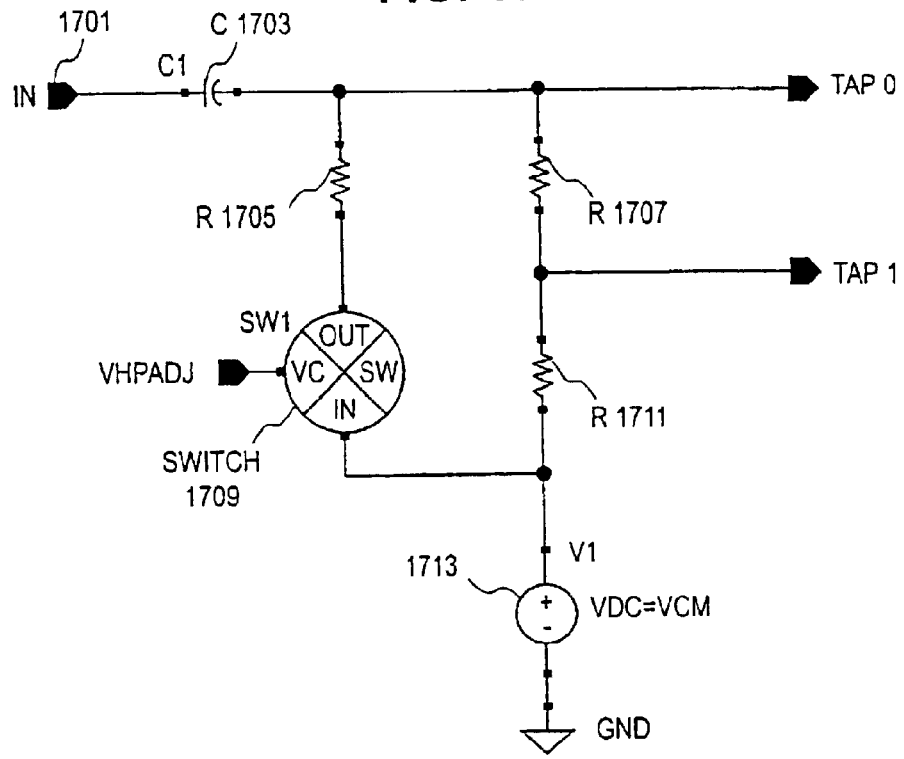
FIG. 17 is a combination schematic and block diagram of a circuit used to change the corner frequency of a HPGA, without affecting the voltage steps available at the taps of the HPGA.

FIG. 17 is a schematic diagram of a circuit used to change the corner frequency of a HPGA without affecting the voltage steps available at the taps of the HPGA. In FIG. 17 the corner frequency of the circuit is determined by capacitor 1703 and resistors R1705, R1707 and R1711. The cutoff frequency is determined by the value of capacitor 1703 and the series combination of resistors R1707 and R1711, in parallel with resistor R1705. By turning on switch 1709 the overall resistance seen in series with capacitor C1703 is changed, however, the ratio of the voltages available at tap 0 and tap 1 remain constant because they are dependent only upon the ratio of R1707 to R1711. The circuit of FIG. 17, however, exhibits a problem. Switch 1709 is configured so that, in order to turn the switch off it is convenient to couple the gate of switch 1709 to the power supply $V_{cc}$. This approach is problematical because a large signal, coupled to the input 1701, will be communicated across capacitor 1703. When the switch 1709 is turned off the entire voltage seen at the juncture of C1703 and R1705 will be coupled to switch 1709. If the switch 1709 turns on during the high point of a large input voltage signal, the corner frequency of the circuit will change as resistor 1705 is switched into the circuit. The corner frequency will then change back when the input voltage no longer exceeds the turn on voltage of the switch 1709 (and switch 1709 turns off). Therefore, if a sufficiently large input signal is encountered, the corner frequency of the circuit may continually change.

Figure 18:
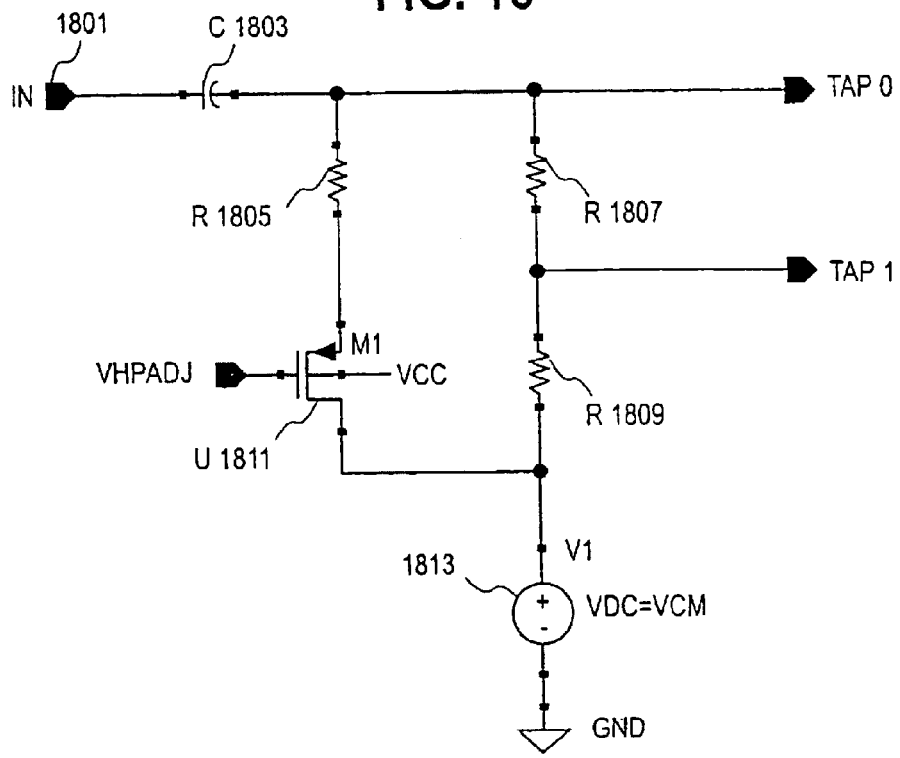
FIG. 18 is a schematic diagram of a circuit used to change a corner frequency of a HPGA without affecting the voltage steps available at the taps of the HPGA.

FIG. 18 is identical to FIG. 17 except that the ideal switch 1709 has been replaced by a MOS switching device U1811. If the gate of switching device 1811 is coupled to the power supply $V_{cc}$, and the source of U1811 receives a voltage that is sufficiently higher than $V_{cc}$, device U1811 will turn on.

Figure 19:
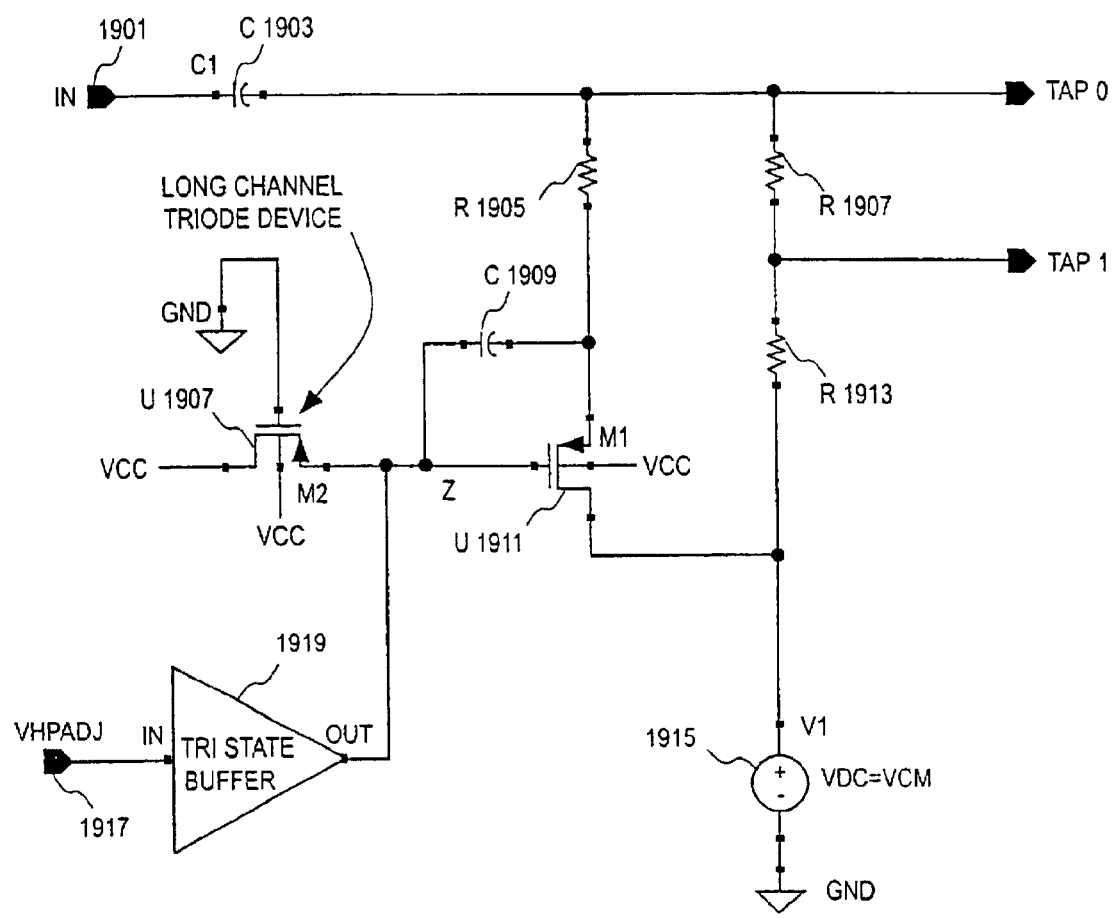
FIG. 19 is a schematic diagram of a HPGA in illustrating the switching device circuitry according to an embodiment of the invention.

FIG. 19 is a schematic diagram in which the switching-device circuitry has been augmented. In FIG. 19, switch U1911 can be turned off without large input voltages causing it to turn back on. The gate of switch U1911 is coupled to a long channel triode device 1907. The long channel triode device may be inserted in lieu of a high resistance resistor. A tri-state buffer 1919 is also coupled to the gate of the switching device U1911. In order to turn the switch U1911 on, the tri-state buffer 1919 leaves the tri-state mode and turns on, thereby coupling the gate of U1911 to ground. To turn device U1911 off, tri-state buffer 1919 is turned off and tri-stated. When the tri-state buffer 1919 turns off and is tri-stated, the gate of U1911 is pulled up to $V_{cc}$ the power supply voltage, conducted by the long channel triode device U1907. If a large signal is input at 1901 the signal couples through C1903 through resistor R1905 and into C1909, but C1909 is coupled across the gate source of switch device U1911. Because the tri-state buffer 1919 and the long channel triode device U1907 are high input impedance devices, substantially no current can be conducted through capacitor C1909. Because essentially no current is conducted through C1909, voltage coupled to C1909 at the junction of C1909 and the source voltage of U1911 is essentially coupled across C1909, to the gate of U1911, thereby preventing U1911 from turning on by keeping the $V_{GS}$ of device 1911 close to 0.

Figure 20:
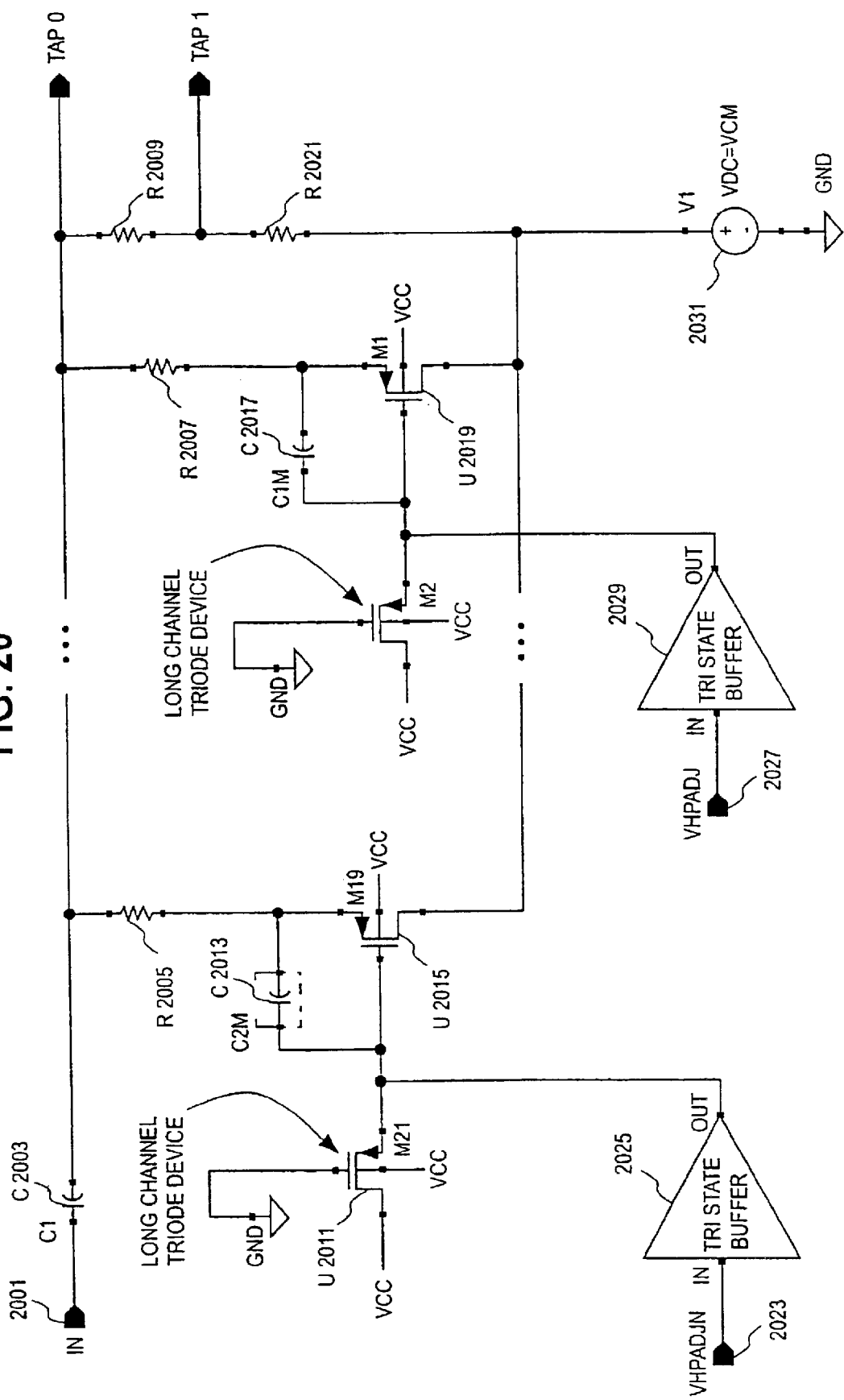
FIG. 20 is a schematic diagram of circuits combined with a HPGA.

FIG. 20 is a schematic diagram of a HPGA having multiple circuits similar to those illustrated in FIG. 19. In FIG. 20 the shunt frequency adjustment resistors, for example R2005, are controlled by switching circuits comprising, a long channel triode device 2011, capacitor 2013 and a tri-state buffer 2025. The same arrangement illustrated in FIG. 19 is repeated for multiple devices (see FIG. 20), resulting in N different corner frequencies. There is a problem, which might be exhibited within the circuitry illustrated in FIG. 20. In FIG. 20, the body of the device U2015 may be tied to $V_{cc}$. The forward biasing of the bulk junction (which comprises device 2015) may cause non-linearity problems. A similar approach to that taken in FIG. 19 may be implemented to correct the nonlinearity problem. That is a long channel device similar to U1907 could be connected between $V_{cc}$ and the body of U2015, instead of tying the body of U2015 directly to $V_{cc}$.

Figure 21:
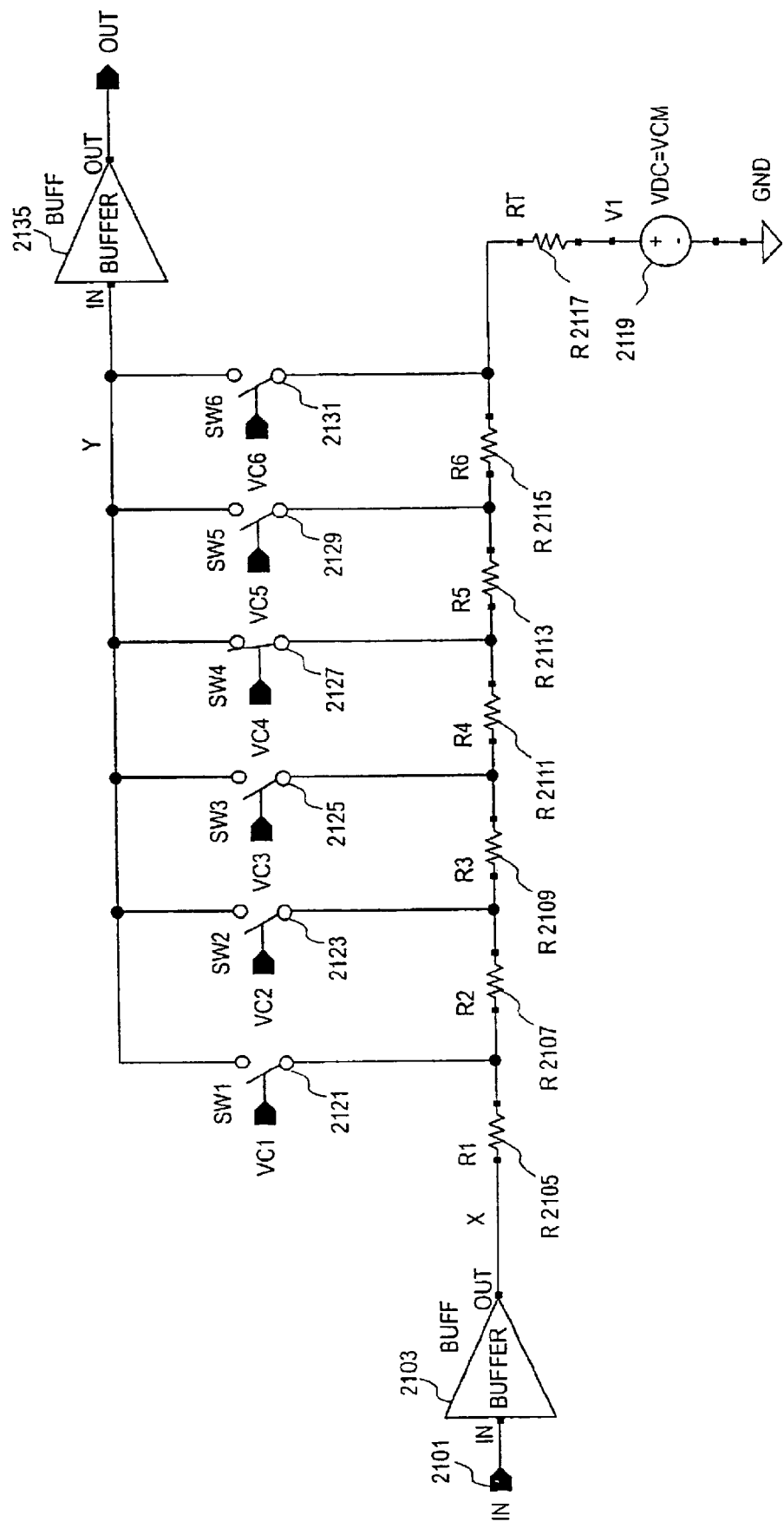
FIG. 21 is a schematic diagram illustrating an exemplary PGA.

In PGAs in which signals are small compared with the power supply voltage it may be desirable to employ a simple switching scheme as illustrated in the prior art of FIG. 21. In FIGS. 21 through 32 embodiments illustrating methods of improving the performance of this type of PGA are described.

FIG. 21 is a schematic diagram illustrating an exemplary prior art programmable PGA gain attenuator. In FIG. 21 a signal is coupled from input 2101 to buffer 2103. The output of buffer 2103 is coupled into a resistive ladder comprising resistors R2105, R2107, R2109, R2111, R2113, R2115 and R2117 arranged in series. The desired voltage is tapped from the resistive ladder through a series of switches 2121, 2123, 2125, 2127, 2129 and 2131. The tapped voltage is then coupled into the output buffer 2135. This architecture has been discussed previously. If the input signal to the resistive ladder is large then problems with switches turning on erroneously becomes a concern. However, the circuit illustrated in FIG. 21 may be used in circuits where the signal to be divided comprises a small peak-to-peak value, thus assuring against transient voltages. The circuitry illustrated in FIG. 21 still exhibits the problem of signals traversing the switches. If the circuitry in FIG. 21 is to be effectively used, then an important consideration is to make the switch resistance as low as possible so that the voltage divider, comprising the switch resistance and the input impedance to buffer 2135, does not cause undesired changes at the input to buffer 2135.

Figure 22:
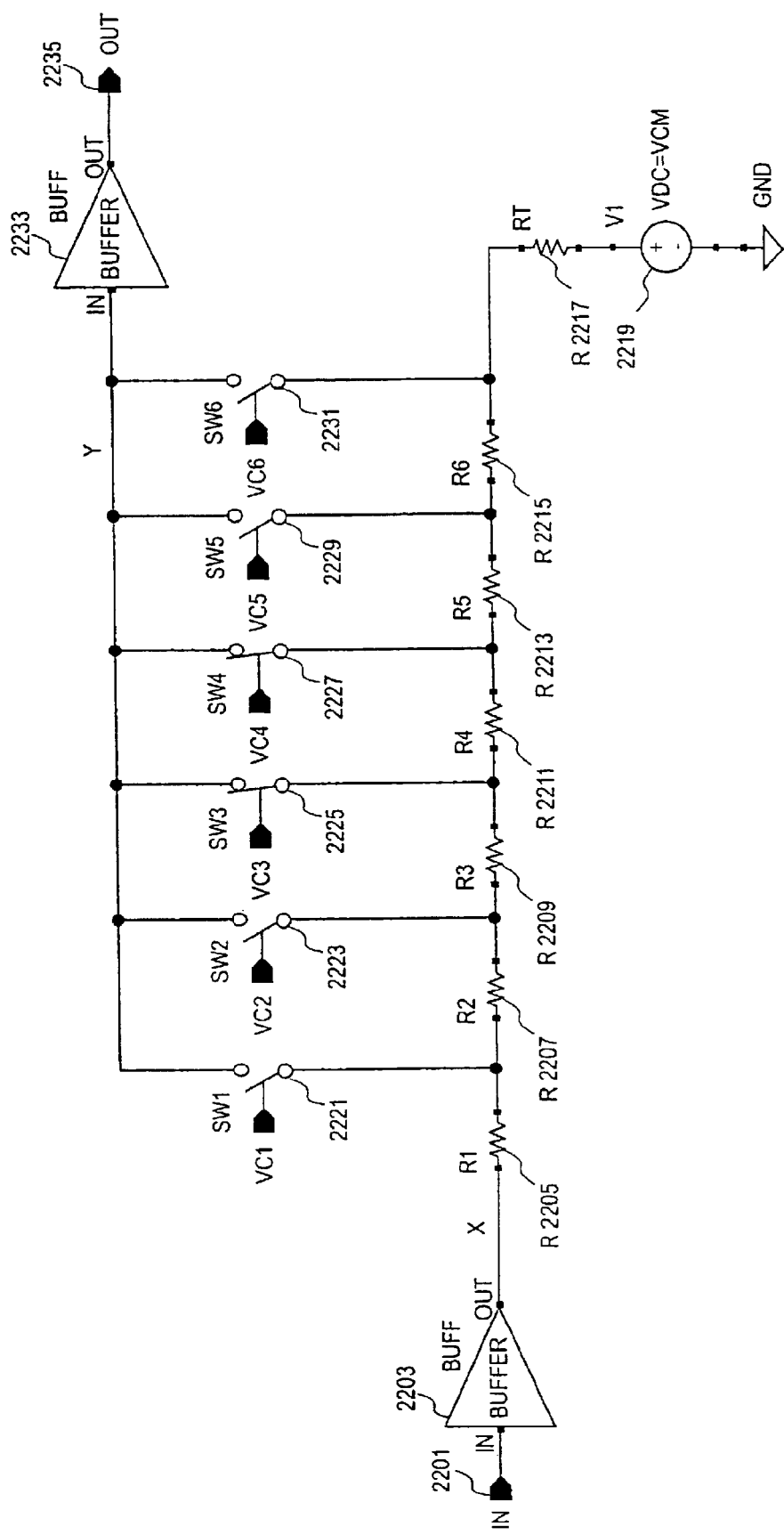
FIG. 22 is a schematic diagram of an exemplary embodiment of the current invention illustrating a sliding window control circuit.

FIG. 22 is a schematic diagram of a portion of an exemplary embodiment of the current invention. FIG. 22 is similar to FIG. 21, except that instead of turning one switch on at a time as illustrated in FIG. 21 with switch 2127, in FIG. 22 two switches, 2225 and 2227 are turned on at the same time. The next tap higher turns on switches 2223 and 2225. The next tap lower turns on switches 2227 and 2229. In this way a sliding window of two switches is used to couple the output buffer 2223 to the resistive ladder. Because two switches are turned on in parallel, the total switch resistance is decreased. This type of sliding window mechanism may be extended to any number of switches. That is, for example, a sliding window of four switches for instance turning on switches 2223, 2225 and 2227 at the same time. A problem with employing a sliding window switching approach is that when the window slides completely towards one or another of the resistive ladder, there is only one switch available. Therefore, in embodiments of the invention in which it is desirable to keep the same attenuation step between taps, additional switches can be added to either end of the divider ladder. A number of switches may be added to either end so that the end switch resistance matches the average switch resistance anywhere within the sliding window of switches.

Figure 23:
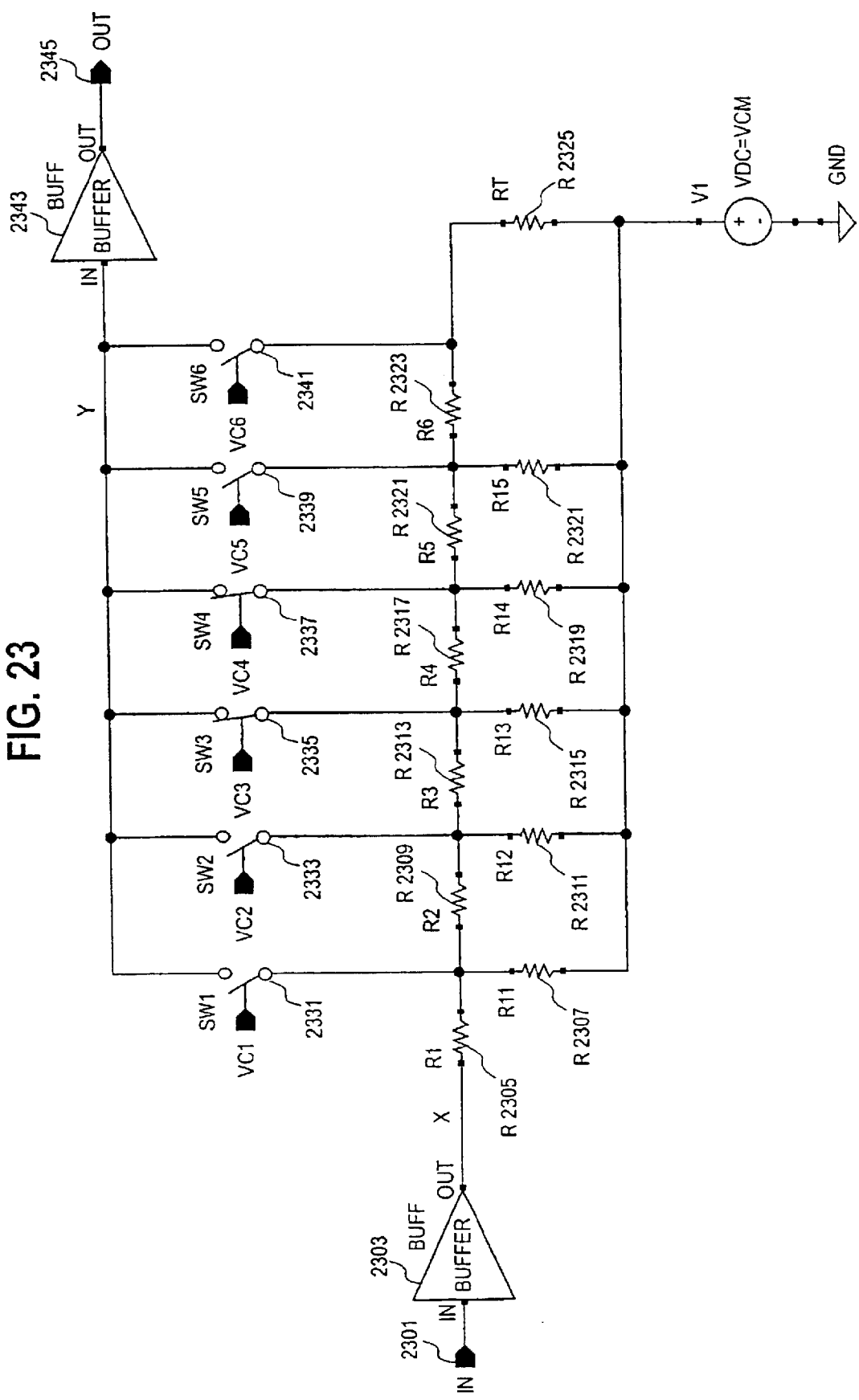
FIG. 23 is a schematic diagram illustrating an example of the sliding window concept applied to an "R to R" resistance ladder.

FIG. 23 is an example of the sliding window concept applied to an "R to R" resistance ladder. An "R to R" ladder as illustrated in FIG. 23 may be used to make the steps between taps logrithmic (on a linear DB scale). In contrast the resistive ladder in FIG. 22 can be used to maintain a linear step between taps. In order to obtain logrithmic steps with a configuration as shown in FIG. 22 without the "R to R" ladder, the resistor values may have to vary by across a larger range than is practical within integrated circuits.

Figure 24:
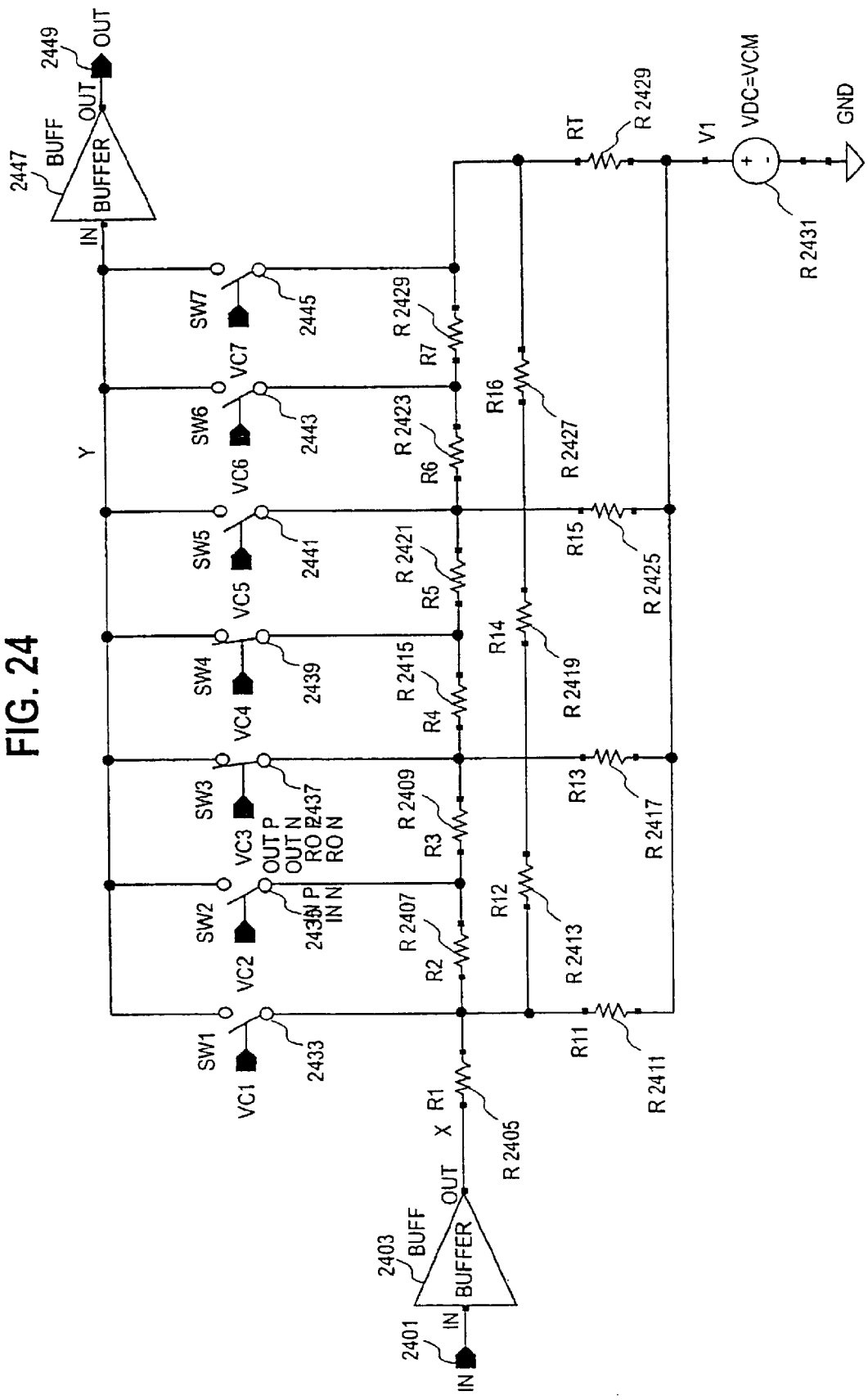
FIG. 24 is a schematic diagram illustrating an embodiment of the invention, in which interpolation resistors have been added.

FIG. 24 is a schematic diagram illustrating an embodiment of the invention in which interpolation resistors are added. In FIG. 24, interpolation resistors R2413, R2419 and R2427 have been added dividing the resistive ladder into multiple segments. By placing an interpolation resistor such as R2413 between two segments, the ratio necessary between the ladder resistors, for example, R2407, R2409 and shunt resistor R2417 can be minimized. If the termination resistor such as 2417 were to get too large in comparison with the resistive ladder resistors, such as R2407 and R2409, there may be implementation problems in obtaining the proper matching ratio in resistors with such disparate values.

Figure 25:
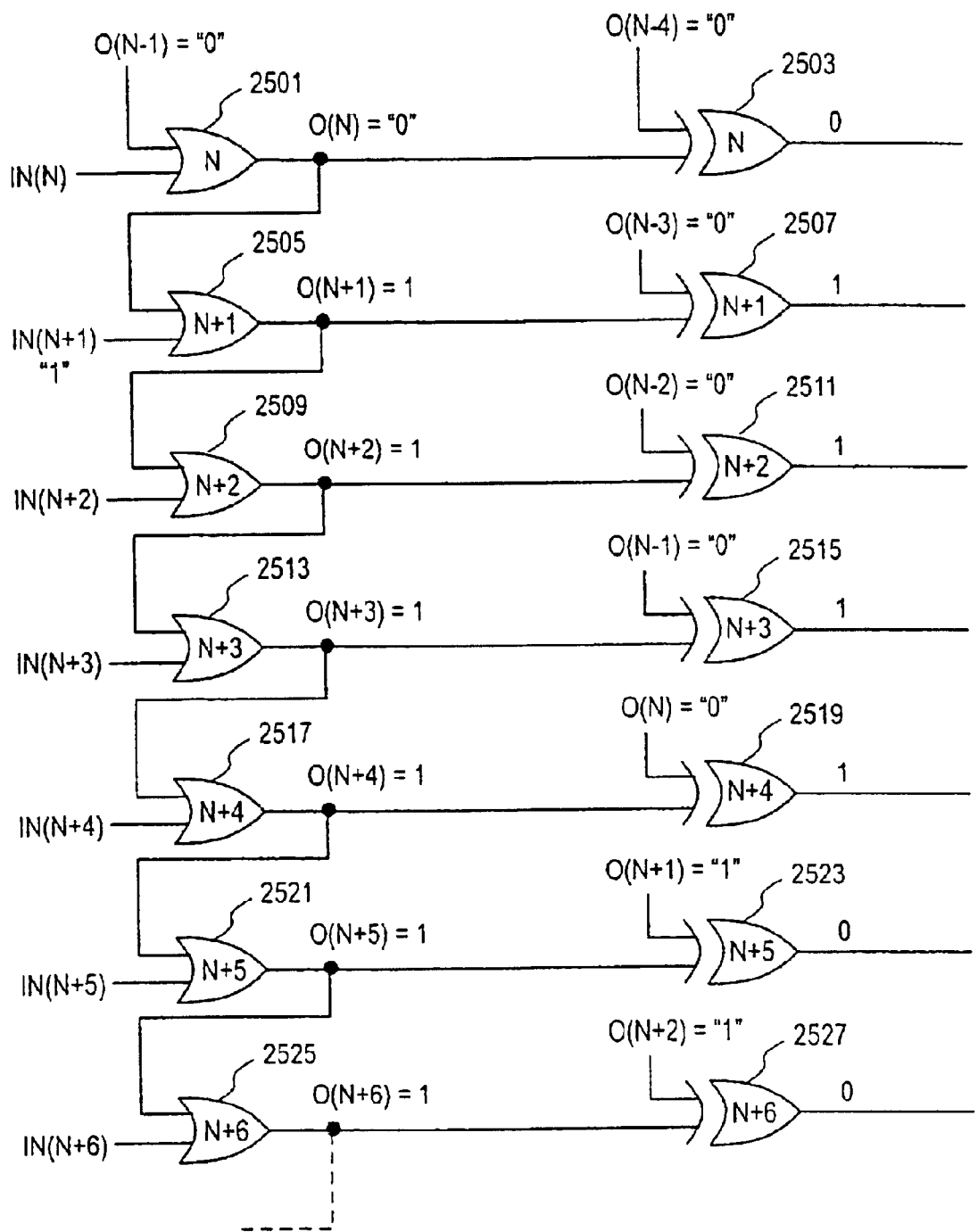
FIG. 25 is a schematic diagram of circuitry, as may be used to implement a sliding window switch control.

FIG. 25 is a schematic diagram of circuitry as may be used to implement a sliding switch window control. One difficulty with implementing controls for sliding ladders is that, as the number of switch taps increases so does the amount of control logic that is necessary to control the taps.

The circuit of FIG. 25 may be used to control a sliding window of switches. The basic logic comprises a daisy chained set of OR gates equal to the number of switches to be controlled. In the illustration in FIG. 25, OR gates number N through N+6 are illustrated. Each OR gate has two inputs. The first input is coupled to the output of the preceding OR gate in a daisy chain fashion. That is, OR gate N+2 has one input which is coupled to the output of OR gate N+1. OR gate N+1 has output of OR gate N as an input. The other input to the OR gate serves as a control signal input. Additionally, the output of each OR gate is coupled to the input of a companion Exclusive OR gate. That is, the output of the Nth OR gate 2501 is coupled to the input of the Nth Exclusive-OR 2503. Similarly, the N+1 OR gate 2505 has its output coupled to the input of the N+1 exclusive OR gate 2507. In other words, each OR gate has a companion Exclusive-OR (exor) gate. The companion Exclusive-OR gate accepts an input from its companion or gate as illustrated in FIG. 25. The second input to the exclusive OR gate is coupled to the output of an OR gate which is further up the daisy chain. The distance between OR gates whose outputs are coupled to the inputs of the exclusive or determines the size of the sliding window. In the illustration in FIG. 25, the sliding window comprises four switches. That is four switches are turned on at any given time. Therefore, the Nth exclusive OR gate has, as its two inputs, the output of the Nth OR gate and the output of the N minus fourth OR gate. In like manner, each of the exclusive OR gates in the chain is coupled to the output of its companion OR gate as well as the output of the or gate which is four OR gates higher in the daisy chain.

For the sake of illustration, an input 1 is coupled into the OR gate N+1. All the OR gates have pull down resistors, or similar mechanisms, such that when a "1" is not coupled into the OR gate's input the input remains in a low or "0" condition. The output of the OR gate N−1 2501 is the OR of one input (which is a 0) and a second input to the Nth OR (gate 2501) (which is also a 0). Therefore the output of OR gate 2501 is a 0. The 0 from the output of OR gate 2501 is coupled to the input of the Nth exclusive OR gate 2503. The output of the N minus 4th OR gate is also coupled into the input of exclusive OR gate 2503. The two inputs to the exclusive OR gate are 0 and therefore the output of exclusive OR gate 2503 is 0. OR gate 2505 has as one input a 1. This 1 marks the location of the beginning of the sliding window of switches that will be turned on. The output of OR (gate 2501) is a 1 and is coupled into an input of exclusive OR gate 2507. The other input of exclusive OR gate 2507 is the output of the OR gate N−3 which is 0. Because the two inputs to exclusive OR gate 2507 are different, the output is equal to 1. Similarly, the one which was inserted into OR gate N+1 is coupled throughout the entire OR gate chain. Therefore, all OR gates after the OR gate N+1 2505 have as their output a 1.

Figure 26:
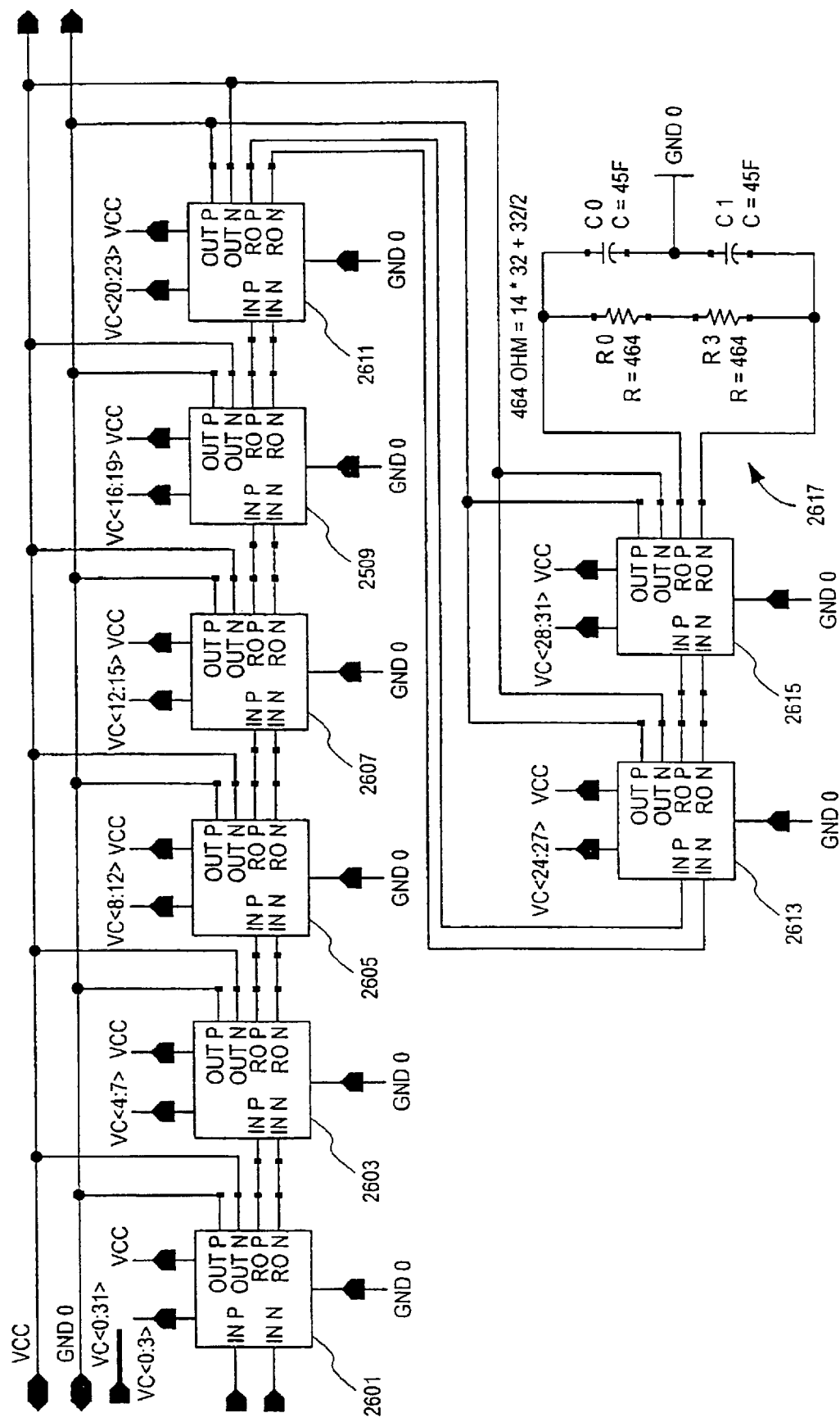
FIG. 26 is a circuit diagram of an eight segment PGA ladder.

FIG. 26 is a circuit diagram of an eight segment programmable gain attenuator ladder. The attenuator ladder comprises eight sections 2601, 2603, 2605, 2607, 2609, 2611, 2613 and 2615. Each of the segments comprises four taps. Section 2617 represents the termination resistors. FIG. 26 represents an actual implementation of a fine programmable gain attenuator 16.

Figure 27:
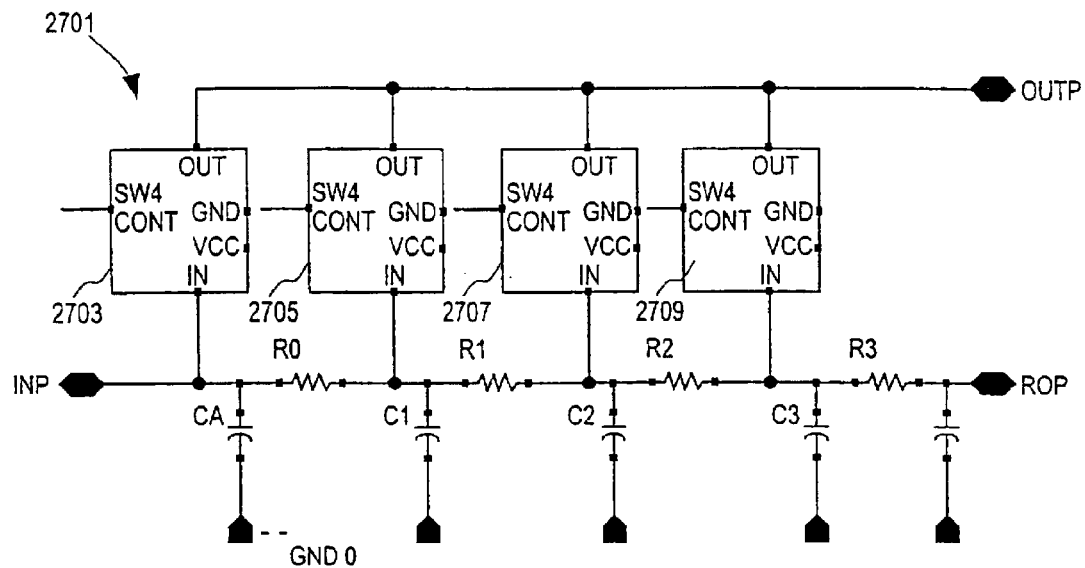
FIG. 27 is a schematic diagram of one of the segments as illustrated in FIG. 26.

FIG. 27 is a schematic of the upper level of one of the segments, for example, 2601, as illustrated in FIG. 26. Segment 2701 comprises four switches, 2703, 2705, 2707 and 2709.

Figure 28:
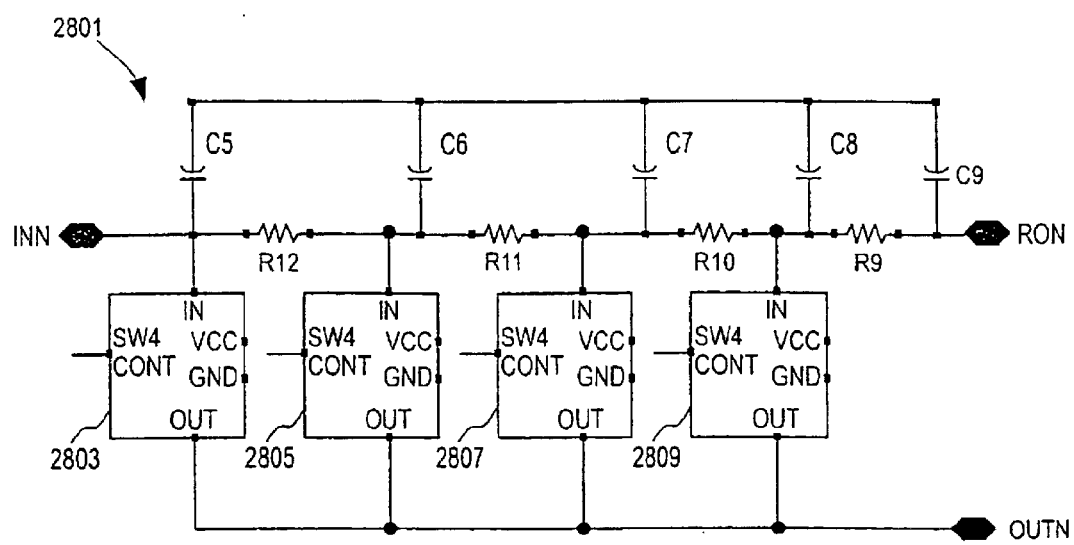
FIG. 28 is a schematic diagram representing another segment as illustrated in FIG. 26.

FIG. 28 is a schematic diagram representing the lower half of the differential segment, such as 2601. The segment illustrated at 2801 comprises four switches, 2803, 2805, 2807 and 2809.

Figure 29:
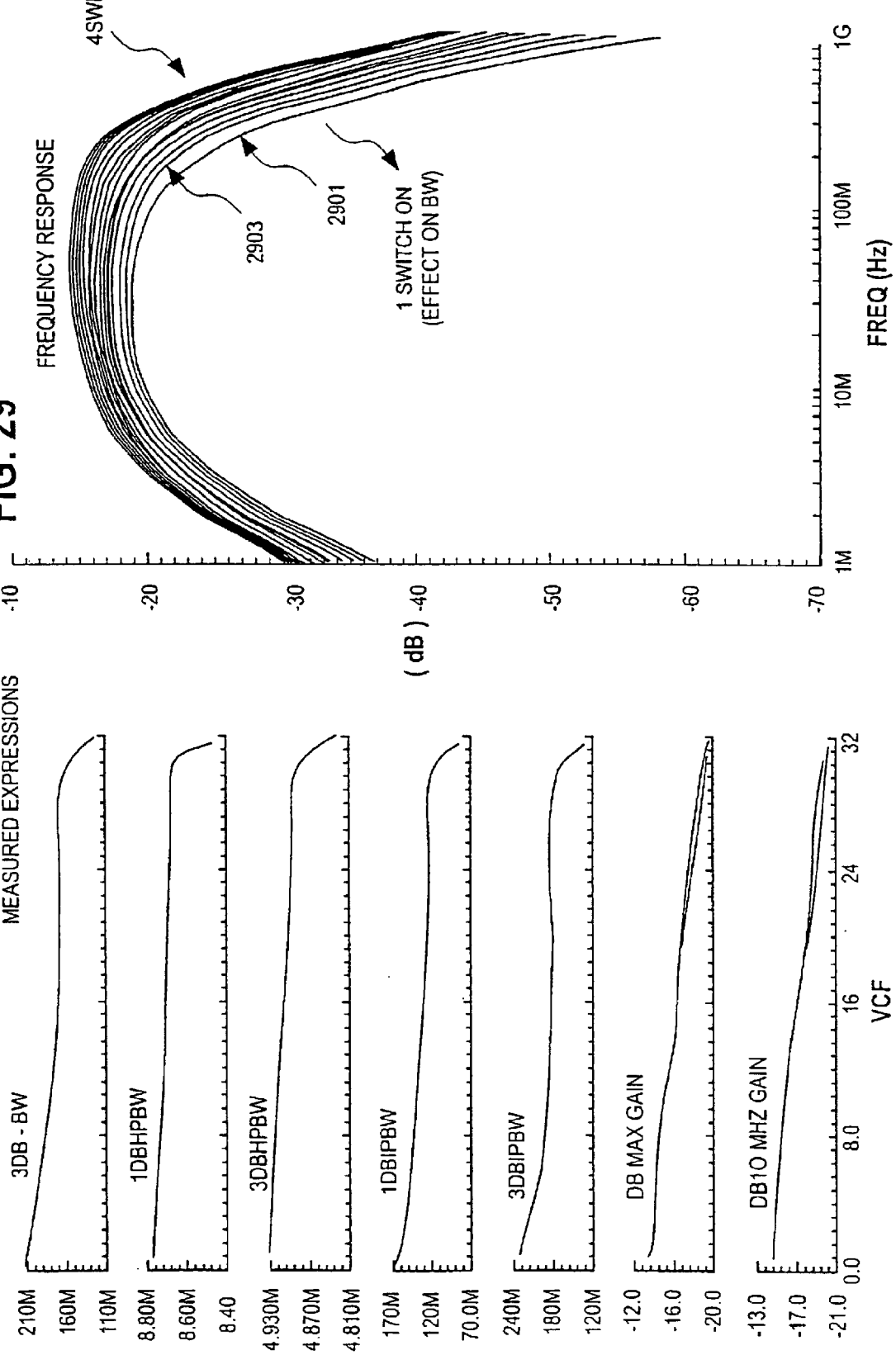
FIG. 29 is a graph of the frequency response of a Bandpass Programmable gain attenuator BPGA according to an embodiment of the present invention.

FIG. 29 is a graph of the frequency response of a programmable gain attenuator according to embodiments of the invention. The graph illustrates 32 curves corresponding to 32 taps of the programmable gain attenuator. The frequency response is a response in which the sliding window of the programmable gain attenuator is four switches. In the present example, the sliding window does not have extra switches at the end of the resistive ladder. The result is curve 2901 representing the case in which the very last tap of the programmable gain attenuator is active and only one switch is on. Curve 2903 represents a curve in which the last two switches of the programmable attenuator are on. The difference in resistance between a system having additional switches at the end of the resistive ladder, results in the markedly different curve shapes as illustrated. In the case of curves 2901 and 2903, the bandwidth rolls off sooner than any of the other curves. Whether the bandwidth rolloff illustrated in curves 2901 or 2903 is significant depends on the application in which the PGA is found. If is critical that the curves match closely, then it may be advantageous to add additional switches at the end of the resistive steps ladder to keep the resistance steps of the sliding window constant.

Figure 30:
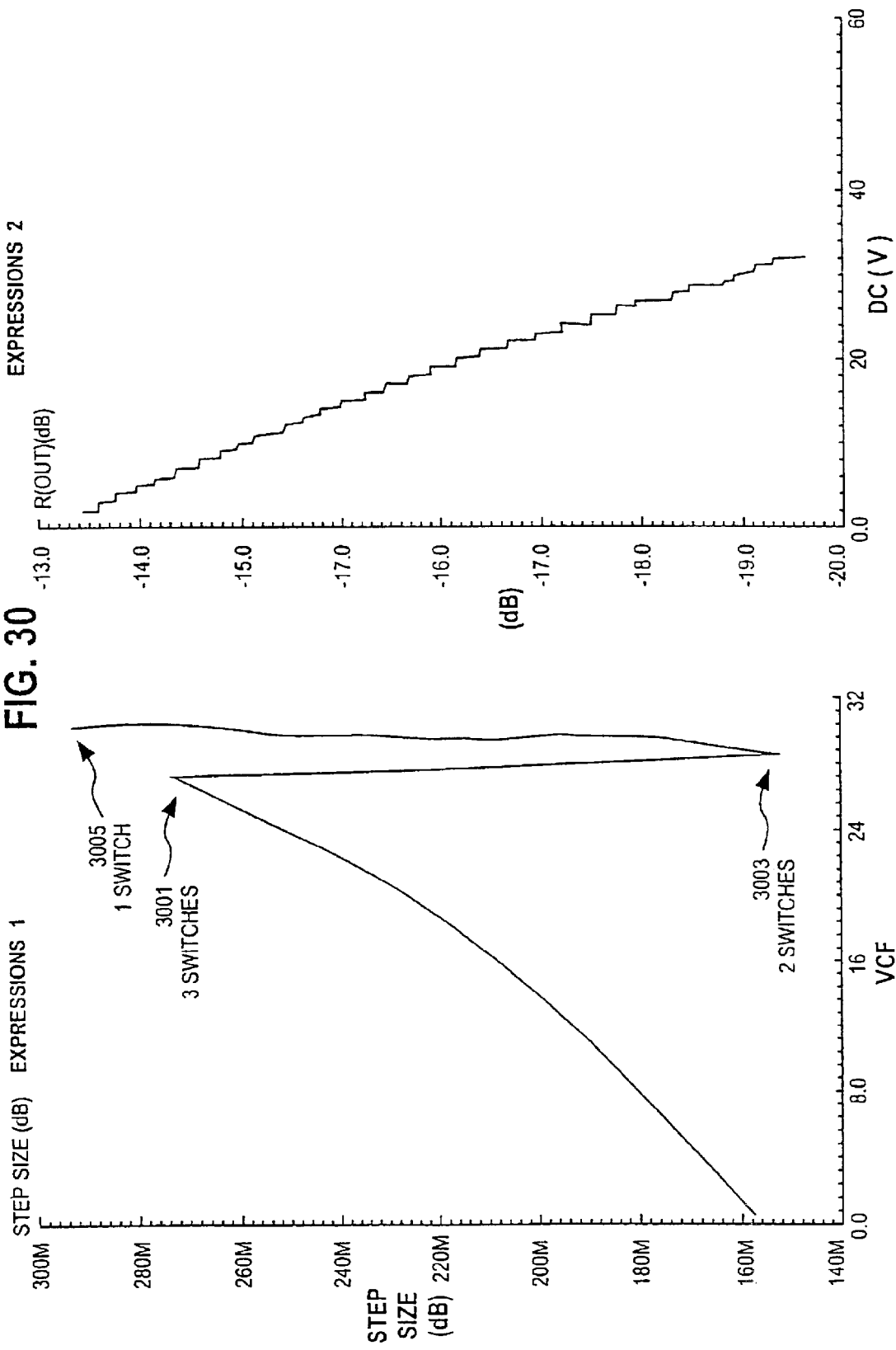
FIG. 30 is a graph of an exemplary PGA step size versus the step number.

FIG. 30 is a graph of the programmable gain attenuator step size versus the step. In the graph of FIG. 30, point 3001 is the point representative of four switches being on. Point 3003 represents two switches being on and point 3005 represents one switch being on. FIG. 30 illustrates the discontinuity in step size experienced by not having switches at the end of the resistive ladder. If such a discontinuity is undesirable, then implementation may include extra switches at the end of the resistive network.

Figure 31:
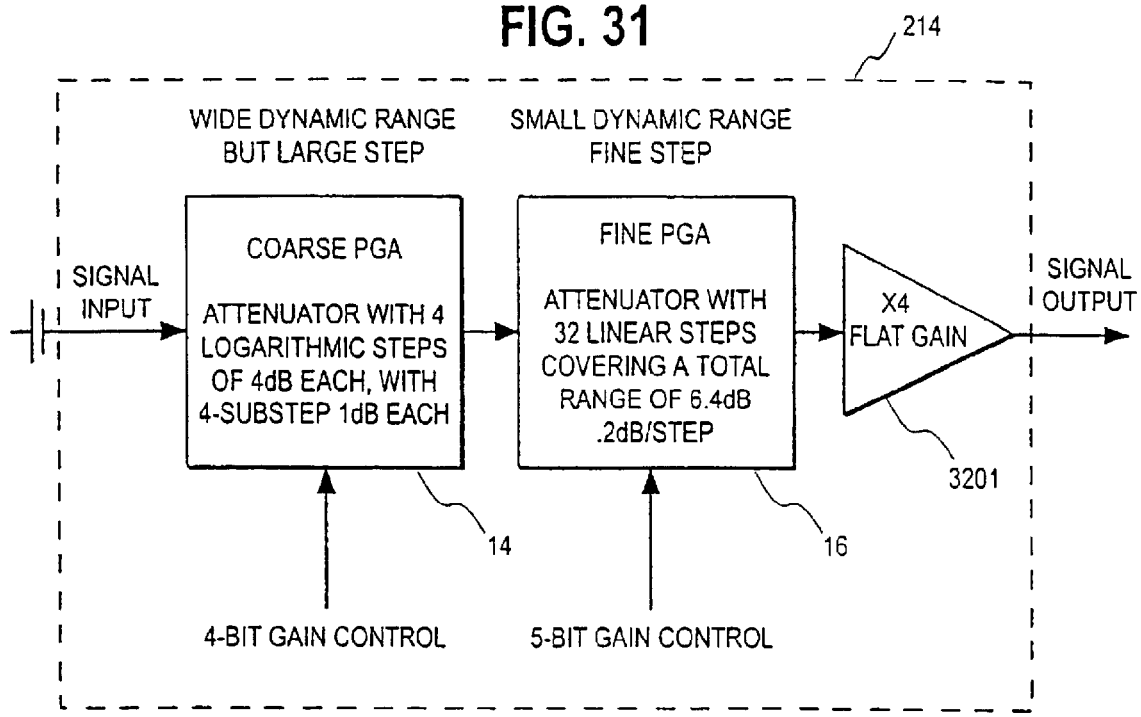
FIG. 31 is a block diagram further illustrating programmable gain amplifier 214.

FIG. 31 is a block diagram further illustrating programmable gain amplifier 214. The programmable gain amplifier 214 comprises three parts, a coarse PGA 14 coupled to a fine PGA 16, coupled to a fourtimes gain amplifier 3201. The coarse PGA has a four-bit gain control. The fine PGA has a five-bit gain control. The response of the overall coarse and fine PGA programmable gain attenuator is illustrated in FIG. 32.

Figure 32:
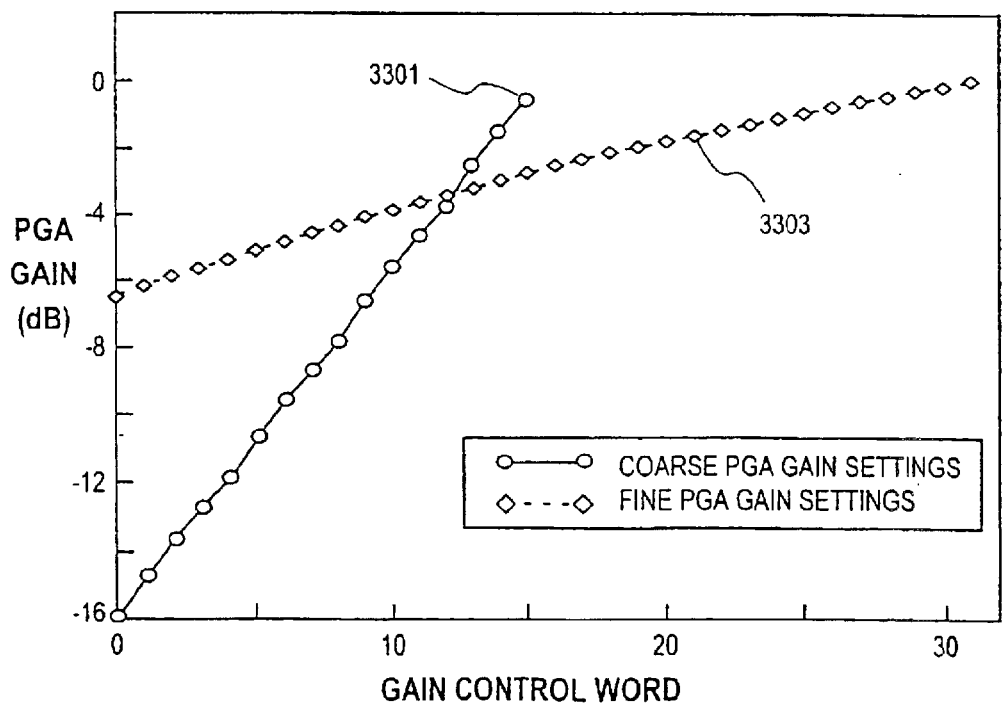
FIG. 32 is a graph of the course and fine steps of combined course and fine PGA's.

FIG. 32 is a graphical plot of the coarse and fine steps of the programmable gain attenuator. 3301 represents the attenuation steps of the coarse programmable gain attenuator. There are 16 discrete steps of programmable attenuation available. Graph line 3303 represents the attenuation steps of the fine programmable gain attenuator. The fine programmable gain attenuator comprises 32 steps corresponding to its five-bit gain control. The coarse and the fine PGA are of different configurations. The schematic of the coarse, 4 Db per step section, PGA is as seen in FIG. 13. This is necessary because the coarse PGA may have significantly large voltage swings coupled into its input. Because of the large voltage swings the input stage which receives the input signal may comprise one or more sections of PGA as illustrated in FIG. 11. This "super coarse" section may be followed by sections as illustrated in FIG. 5 and FIG. 13. FIG. 5 and FIG. 13 together may comprise the overall PGA. This coarse gain section is followed by a 1 db per step section Although the serial arrangement of the coarse and the fine PGA is arbitrary in an equivalent electrical sense, from a practical standpoint by placing the coarse PGA first the signal to the fine PGA may be reduced to the point where techniques not appropriate for the circuitry of the coarse PGA can be applied to the fine PGA. The fine PGA, accordingly, accepts significantly reduced voltage swings when compared with the coarse PGA and, therefore, a sliding window approach, as illustrated in FIG. 22, may be utilized.

Linearity in the coarse PGA is achieved in part by eliminating the signal path through the switch steps. In the fine PGA, however, linearity is achieved through the sliding window approach, which is viable because of the lower signal levels which travel through the fine PGA. The overall response of the coarse and fine PGA is the sum of the gain settings as illustrated in graph FIG. 33. The fine PGA provides 32 steps of approximately 0.2 dB and the coarse PGA effectively provides 16 steps of approximately 1 dB. Both PGA are controlled by an automatic gain control circuit 220.

Figure 33:
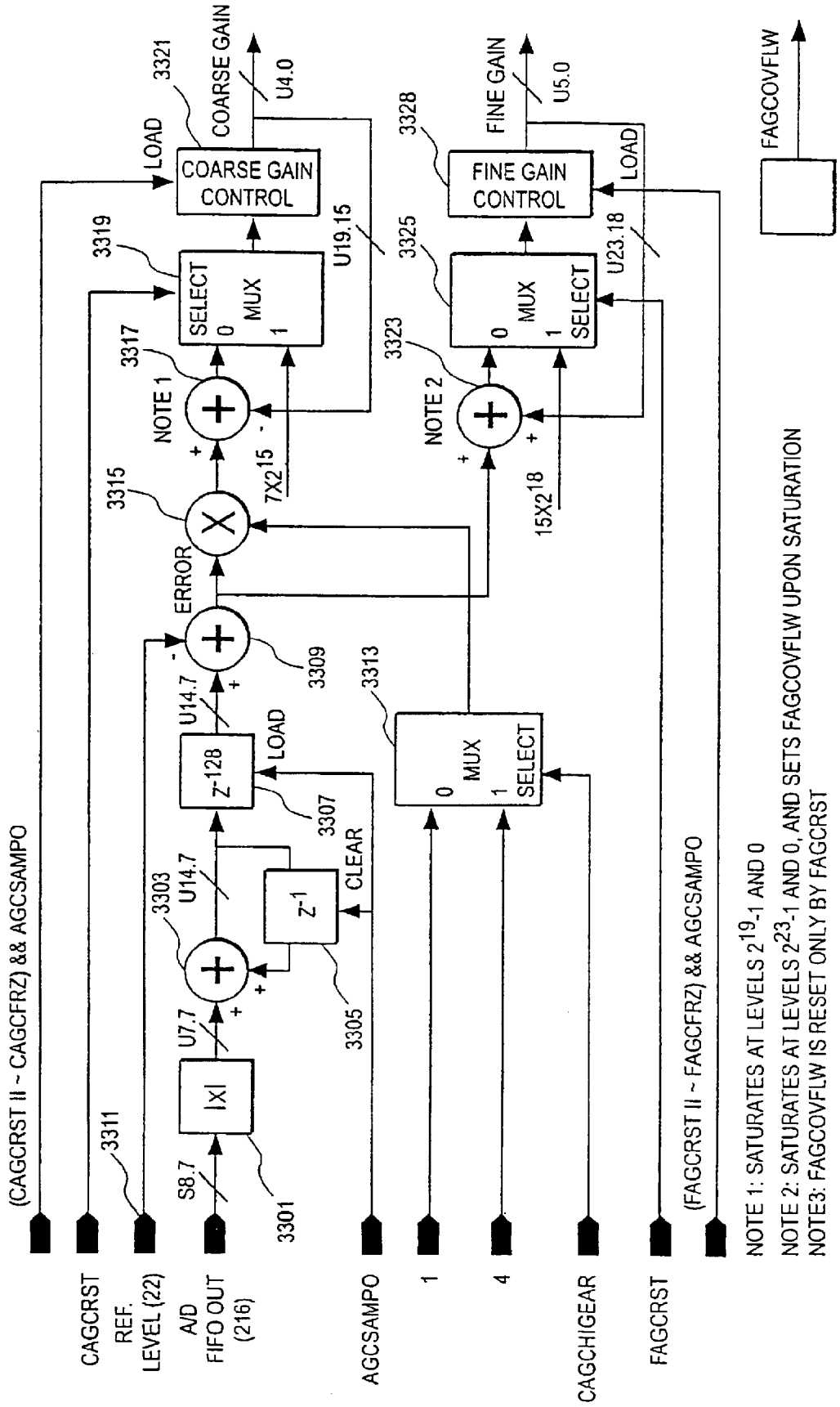
FIG. 33 is a block diagram of an AGC system as may be used to control PGAs according to an embodiment of the invention.

FIG. 33 is a block diagram of an automatic gain control (AGC) according to embodiments of the invention. Automatic gain control 220 controls the setting of both the coarse programmable gain attenuator 16 and the fine programmable gain attenuator 14. The automatic gain control 220 is a digital control loop in which the signal level at the output of the PGA 214 (as represented in the A-D FIFO 218) are compared to a setpoint 222.

When the gigabit transceiver system is turned on, the fine PGA 14 is set to a midpoint value by the automatic gain control 220. The automatic gain control 220 then goes through a process which sets the coarse PGA 16 to a setting such that a signal in an acceptable range is received into the A-D FIFO 218. In the present illustrative embodiment of the invention, the coarse PGA is then maintained at the setting and all adjustments in the signal level are accomplished through the use of the fine PGA 14. It is the function of the AGC circuit to keep level of the overall signal coupled into the A-D converter 216 nearly as constant as possible.

The gigabit signal that will be received by the gigabit transceiver is a complex signal. It is advantageous to pass the gigabit signal through the PGA and into the A-D without having the signal clip, that is without the received signal being so large that it exceeds the input range of the A/D 216. If the signal does clip, then errors will be introduced in the received data stream. It is a characteristic of the gigabit signal, however, that the peak values occur only sporadically. For example, a typical gigabit signal may exhibit a peak value only once in $10^{15}$ samples. Although once in $10^{15}$ samples is a large number, a typical requirement of the overall receiver is one error in $10^{15}$ samples. Therefore, a clipping rate of one in $10^{15}$ may be too high, as it may consume the entire error tolerance of the system. On the other hand, it is advantageous to utilize most of the range of the A-D converter 216 in order to achieve the best resolution possible of the A-D 216. Accordingly, if the set point of the AGC is too low, the effective resolution of the signal is decreased.

It, however, is very difficult to control the level of the signal using the peak values, because the peak values occur so infrequently. Therefore, another method of control for the automatic gain control 220 may be advantageous. In the present embodiment of the invention, the level of the automatic gain control 220 may be controlled by using the RMS (Root Mean Squared) value of the signal, because the ratio of the RMS value to the peak value of the signal is essentially a constant, but may vary somewhat depending on such factors as the length of the cable linking the gigabit transceiver to the gigabit receiver.

To determine the RMS value of a signal it is typical to square the value of the signal and to compute its average value over a suitable period of time. This procedure can be used in embodiments of the invention but requires significant computing power, in the form of a multiplier to square the value of the signal. Instead, however, the average absolute value of the signal is directly related to the RMS value assuming that the distribution of the signal is filed. A Gaussian distribution yields a reasonable approximation of the distribution of the gigabit signal. Using a Gaussian distribution, the ratio of the average absolute value of the signal to the RMS value has been determined by simulation to be 0.7979. Using this result, a target value can be set for the expected absolute value. The target value is set so that the peak value of the signal is near to full range of the A-D converter.

The coarse PGA is adjusted during the start-up process and is then frozen. No further adjustments to the coarse PGA occur until the system is restarted. During start-up, the fine PGA is maintained at a center value while the coarse PGA is adjusted. When the start-up process is complete the coarse PGA is frozen and any changes in signal level are accounted for by the fine PGA. The purpose of the adjustment of the fine PGA is to account for any small changes in the signal resulting from such causes as temperature change within the environment.

FIGS. 33 and 34 illustrate an AGC system as may be used to control PGAs such as those described above.

FIG. 33 illustrates the functioning of the automatic gain control, according to an embodiment of the invention. A coarse gain control output register 3321 provides a four bit gain control for the coarse PGA. A fine gain control output register 3328 provides five bits of control for the fine gain PGA. The notation associated with the coarse gain, e.g., U4.0, indicates the number of bits as well as what portion of the total number of bits, which are fractional. Therefore, the notation U4.0, of the coarse gain control, indicates an unsigned four bit quantity with zero fractional part. In contrast, the input to absolute value block 3301 has a notation of S8.7. The S8.7 indicates that the quantity is a signed quantity and that the fractional portion of that quantity is 7 of the 8 bits.

Absolute value block 3301 accepts a sample from the A-D FIFO 216, which is in the receive clock domain. A second clock domain comprises the analog clock domain, which is used, for example, to sample the input signal at the line interface 210. By accepting the signal from the receive clock domain, automatic gain control 220 bridges the gap between the analog sampling domain and the receive clock domain. The receive clock domain is asynchronous with respect to the input sampling clock domain. For this reason, the A-D FIFO 216 is used to couple one clock domain to another without losing data.

In absolute value block 3301 the absolute value of the accepted signal is taken. The sign bit is thereby eliminated. Therefore, the output of the absolute value block 3301 is an unsigned 7 bit number represented by the notation U7.7. Block 3305 in combination with block 3303 form an accumulator circuit. The accumulator circuit accumulates values from the absolute value block 3301 over 128 cycles. Once 128 cycles have been accumulated, the accumulated value is then provided to block 3307 and the accumulated value, represented in block 3305, is cleared. In other words, blocks 3301 and 3305 define an accumulate and dump filter. When the AGC process is started, the accumulate and dump filter is initially cleared. The accumulate and dump filter will then accumulate a value over 128 clock cycles. Once the accumulate and dump filter has operated over the 128 cycles, the accumulated value will be transferred to register 3307, and a new accumulation cycle will begin. Because register 3307 is loaded only once every 128 clock cycles, it is clocked at 1/128 of the receiver clock frequency. In the present exemplary embodiment, the symbol rate from the receive clock is 125 MegaHertz (MHz). Therefore, the clocking of values into and out of register 3307 takes place at a clock frequency equal to 125 MHz divided by 128 or approximately 1 MHz. As a consequence, the remainder of the AGC need only run at a 1 MHz rate. The output of the register 3307 is a representation of the accumulated absolute value of the signal. The output of register 3307 should be equal to the reference level 331, which is equivalent to a setpoint 222 of the automatic gain control. In principle, the function of the AGC is to change the number appearing in register 3307 such that it is as close as possible to the reference level 3311. The difference between the reference level 3311 and the output of register 3303 is computed in block 3309. The output of block 3309 represents an error signal defining the difference between the reference level and the average absolute value of the gigabit signal. The reference level coupled into the AGC at 3311 in the present embodiment is a number found by simulation (as discussed previously). The error signal at the output of block 3309 ideally will be zero. In practice the error value is always some non-zero value. The error value from the output of block 3309 is then scaled in block 3315. Block 3313 selects the value to multiply by the error signal. In the present embodiment, block 3313 can provide either a one times or a four times multiplication depending on the value of its select line. The select line of block 3313 is represented in FIG. 33 by the input line label Cagchigear. The error value multiplied by the selected amplification factor is then coupled into the accumulator circuit comprising comparison block 3317 multiplexor 3319 and coarse gain control register 3321. The circuit comprising blocks 3317, 3319 and 3321 form an integrator, which integrates the error signal. This integrator circuit is used to control the coarse gain PGA, thereby forming a feedback control loop. Similarly the error signal output from block 3309 is coupled into the integrator circuit comprising blocks 3323, 3325 and 3328. The fine gain AGC does not include the scaling factor provided by block 3315 to the coarse AGC. Additionally, the fine gain control register 3328 represents five output bits as opposed to the four output bits of the coarse gain control register. These two factors contribute to the fact that the fine gain control loop has a slower response. The fine gain loop is also a more precise loop, having one more bit of resolution.

Initially, the coarse gain AGC is converged by being operated for a period of time. During the period that the coarse AGC is being operated, the fine gain AGC is set to a midrange value, and the fine AGC control remains reset. Once the coarse gain AGC has converged to a value, the value is frozen and the fine gain AGC is then activated. The fine gain AGC then provides control of the AGC loop.

The multiplying factor provided to the coarse gain AGC loop through block 3315 can be used to hasten the convergence of the coarse gain AGC loop. Initially, when the coarse gain AGC is turned on, the multiplication factor can be set to the higher value, in this case four, in order to speed the convergence initially of the coarse gain loop. Once the initial portion of the convergence has taken place, the gain factor can be switched to the lower gain factor, in this case one, in order to achieve a more precise convergence.

There are multiple ways to compute the peak to RMS ratios of a signal such as used with embodiments of the present invention. In the case of the present invention, the peak to RMS ratio used have been computed experimentally through the use of simulation. The absolute peak value of the signal is fairly easy to compute, but it is too pessimistic because the probability of reaching it may be orders of magnitude lower than the specified error rate. For example, if the specified error rate is one in $10^{15}$ using the absolute peak value of the signal may result in an error rate as low as one in $10^{30}$. By setting the PGA so that the gigabit signal never exceeds the input range of the A/D 216. A very low error rate is achieved, but the attenuation of the PGA is so high that signal resolution is sacrificed. The specified error rate (SER) is the error rate at which errors are produced at an acceptable level for the operation of the system. An assumption is made that although clipping of the input signal is undesirable, sporadic clipping is relatively harmless if its probability is much lower than the SER.

Therefore, the present computation proceeds with the assumption that the probability of sporadic clipping is to be kept lower than the SER, but higher than the probability of error if the absolute peak value of the signal were used.

To compute the probability of clipping at a certain level the probability density function (PDF) of the signal may be first ascertained, then the clipping level can be set such that the probability of clipping is sufficiently low, for example, 1 in $10^{15}$. For this purpose, a Gaussian-type distribution function was examined to determine if the Gaussian distribution could approximate the PDF of the gigabit signal sufficiently to be used in lieu of the PDF function of the gigabit signal. It was found that a Gaussian approximation is not sufficient because the critical part of the probability density function, in this case the tail, is not sufficiently represented by the Gaussian approximation. In other words, the trailing portion of the probability density function, which is integrated in order to find the probability of exceeding a certain magnitude, is not well approximated by a Gaussian distribution. It was found, through simulation, that a better approach is to use a bound for the tail of the probability density function such as the Chernoff Bound. The Chernoff Bound can be computed relatively easily based on the impulse response of the gigabit transmission and echo paths, and can be used to provide an accurate estimate of the probability of clipping. A program named peak bound was written to compute the peak to RMS ratios and to set the target value of $E\{|x|\}$. The Chernoff bound is represented below.

$$P(X>x) \leq e^{-sx}\phi X(s) \qquad \text{equation 1.}$$

In the Chernoff Bound equation, the first term P(X>x) indicates that the probability of the PDF function is less than a certain value x, which in this case has been set to $10^{-15}$, is less than or equal to $e^{-sx}\phi X(s)$. The approximation turns out to be accurate and so can be, for practical purposes, written as an equals type equation instead of less than or equal, as shown in equation 2 below.

$$P(X>x) \leq e^{-sx}\phi_X(s) \qquad \text{equation 2.}$$

$\phi X(s)$ is the Fourier transfer of the probability density function. The characteristic function can be computed based on the impulse response of the gigabit transmission cable. Computation of the characteristic function is well known in the art. The term S within the Chernoff Bound equation is a number that is adjusted, in the present computation, in order to achieve the tightest possible bound. The tightest possible bound is equivalent to the lowest probability. The value of S can be found through numerical methods.

What is claimed is:

1. A circuit for providing a programmable gain comprising:
   a first programmable gain amplifier (PGA) comprising:
      an input that receives an input signal to be amplified;
      a first plurality of impedances coupled to divide the input signal into a plurality of voltage levels;
      a plurality of amplifier circuits coupled to receive the plurality of voltagelevels; and
      a plurality of switches that disconnect each of the amplifier circuits from a power supply, thereby deactivating each amplifier; and
   a second PGA configured to receive a voltage level from the first PGA, the second PGA comprising:
      a second plurality of impedances coupled to divide the voltage level from the first PGA into a plurality of voltage levels;
      and a second plurality of switches that couple said plurality of voltages into a buffer amplifier circuit.

2. The circuit as in claim 1, wherein the first plurality of switches that disconnect each of the amplifier circuits from a power supply, disconnect each amplifier by disconnecting the amplifier from ground.

3. The circuit as in claim 1, wherein the first plurality of switches that disconnect each of the amplifier circuits from a power supply, disconnect each amplifier by disconnecting the amplifier from the power supply voltage.

4. The circuit as in claim 1, wherein the first plurality of switches comprise a plurality of semi-conductor devices.

5. The circuit an in claim 1, wherein the first plurality of amplifiers comprise a plurality of semi-conductor devices.

6. The circuit an in claim 5, wherein the semi-conductor devices comprise MOS (metal oxide semi-conductor) devices.

7. The circuit an in claim 5, wherein the semi-conductor devices comprise MOS semi-conductor devices.

8. The circuit an in claim 1, wherein the second plurality of switches are semi-conductor switches.

9. The circuit an in claim 8, wherein the semi-conductor switches are MOS devices.

10. The circuit an in claim 1, further comprising a circuit that operates a number of adjacent switches, of the second plurality of switches, concurrently.

11. The circuit an in claim 1, wherein the second plurality of switches further comprises a plurality of switches in parallel that couple the highest voltage level from the second plurality of impedances in the buffer amplifier.

12. The circuit an in claim 1, wherein the second plurality of switches further comprises a plurality of switches in parallel that couple the lowest voltage level from the second plurality of impedances into the buffer amplifier.

13. The circuit an in claim 11, wherein the number of switches in parallel is the same as the number of switches operated concurrently.

14. The circuit as in claim 12, wherein the number of switches in parallel is the same as the number of switches operated concurrently.

* * * * *